(12) United States Patent
Onuma et al.

(10) Patent No.: US 11,508,708 B2
(45) Date of Patent: Nov. 22, 2022

(54) SEMICONDUCTOR MODULE, DISPLAY APPARATUS, AND SEMICONDUCTOR MODULE MANUFACTURING METHOD

(71) Applicant: SHARP KABUSHIKI KAISHA, Sakai (JP)

(72) Inventors: Hiroaki Onuma, Sakai (JP); Takashi Ono, Sakai (JP); Hiroyoshi Higashisaka, Sakai (JP); Tsuyoshi Ono, Sakai (JP); Takashi Kurisu, Sakai (JP); Toshio Hata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 289 days.

(21) Appl. No.: 16/637,685

(22) PCT Filed: Jul. 19, 2018

(86) PCT No.: PCT/JP2018/027076
§ 371 (c)(1),
(2) Date: Feb. 7, 2020

(87) PCT Pub. No.: WO2019/031183
PCT Pub. Date: Feb. 14, 2019

(65) Prior Publication Data
US 2021/0134773 A1 May 6, 2021

(30) Foreign Application Priority Data

Aug. 10, 2017 (JP) .............................. JP2017-155904
Oct. 24, 2017 (JP) .............................. JP2017-205600

(51) Int. Cl.
H01L 25/16 (2006.01)
H01L 25/18 (2006.01)
H01L 27/15 (2006.01)
H01L 33/60 (2010.01)
H01L 33/00 (2010.01)
H01L 33/20 (2010.01)

(52) U.S. Cl.
CPC ............ *H01L 25/167* (2013.01); *H01L 25/18* (2013.01); *H01L 27/156* (2013.01); *H01L 33/0093* (2020.05); *H01L 33/60* (2013.01); *H01L 33/20* (2013.01)

(58) Field of Classification Search
None
See application file for complete search history.

(56) References Cited

U.S. PATENT DOCUMENTS 9,472,714 B2 10/2016 Hsia et al.
2008/0113462 A1* 5/2008 Kim .................... H01L 33/0093
438/33

(Continued)

FOREIGN PATENT DOCUMENTS

JP 2008262993 A 10/2008
JP 2017-054092 A 3/2017

(Continued)

Primary Examiner — Robert K Carpenter
(74) Attorney, Agent, or Firm — ScienBiziP, P.C.

(57) ABSTRACT

A semiconductor module includes a ground substrate that is provided with a drive circuit, and a plurality of light emitting elements that are electrically coupled to the drive circuit, in which a distance between the light emitting elements adjacent to each other is equal to or less than 20 μm in a top view.

15 Claims, 12 Drawing Sheets

(56) References Cited

U.S. PATENT DOCUMENTS

| | | |
|---|---|---|
| 2009/0315045 A1 | 12/2009 | Horie |
| 2010/0314605 A1 | 12/2010 | Khan |
| 2015/0279902 A1* | 10/2015 | Von Malm .............. H01L 29/78 |
| | | 438/23 |
| 2017/0358505 A1* | 12/2017 | Chang ................... H01L 25/167 |
| 2018/0059477 A1* | 3/2018 | Jang .................. G02F 1/133308 |
| 2018/0122997 A1 | 5/2018 | Herrmann |

FOREIGN PATENT DOCUMENTS

| | | |
|---|---|---|
| WO | 2007/126092 A1 | 11/2007 |
| WO | 2016/180732 A1 | 11/2016 |

\* cited by examiner

10: SEMICONDUCTOR MODULE
11: GROUND SUBSTRATE
11a: DRIVE CIRCUIT
14: ELECTRODE
15: LIGHT EMITTING ELEMENT
18: GROWTH SUBSTRATE
20: GROOVE
21: GaN FILM

101A: SEMICONDUCTOR MODULE
11: GROUND SUBSTRATE
11a: DRIVE CIRCUIT
14: ELECTRODE
15: LIGHT EMITTING ELEMENT
18: GROWTH SUBSTRATE
20: GROOVE
31: LIGHT BLOCKING MEMBER 102A, 102B: SEMICONDUCTOR MODULE
11: GROUND SUBSTRATE
11a: DRIVE CIRCUIT
14: ELECTRODE
15, 152: LIGHT EMITTING ELEMENT
161a, 161b: RESIN
20: GROOVE
22a, 221: PROTRUSION
32, 231: RECESS
183a, 183b: GROWTH SUBSTRATE

103: SEMICONDUCTOR MODULE  32, 231: RECESS
11: GROUND SUBSTRATE  41: LIGHT-TRANSMISSIVE RESIN
11a: DRIVE CIRCUIT  42, 43: COLOR CONVERSION LAYER
14: ELECTRODE  152: LIGHT EMITTING ELEMENT
20: GROOVE  162: RESIN

104: SEMICONDUCTOR MODULE  41: LIGHT-TRANSMISSIVE RESIN
11: GROUND SUBSTRATE  42, 43: COLOR CONVERSION LAYER
11a: DRIVE CIRCUIT  51, 52: LIGHT ABSORPTION LAYER
14: ELECTRODE  152: LIGHT EMITTING ELEMENT
20: GROOVE  163: RESIN
32, 231: RECESS

SEMICONDUCTOR MODULE, DISPLAY APPARATUS, AND SEMICONDUCTOR MODULE MANUFACTURING METHOD

TECHNICAL FIELD

The present invention relates to a semiconductor module, a display apparatus, and a semiconductor module manufacturing method.

BACKGROUND ART

PTLs 1 and 2 disclose a semiconductor module manufactured by separating off a growth substrate from a light emitting element.

CITATION LIST

Patent Literature

PTL 1: U.S. Patent Application Publication No. US2010/0314605 (published on Dec. 16, 2010)
PTL 2: U.S. Pat. No. 9,472,714 (published on Oct. 18, 2016)

SUMMARY OF INVENTION

Technical Problem

In the semiconductor module disclosed in PTLs 1 and 2, a base substrate has only a function of supporting a light emitting element provided thereon, and thus attention is not paid to whether or not the base substrate is damaged in a configuration of a light emitting device and a step of separating off a growth substrate. Therefore, in the semiconductor module, a case where a base substrate having functions including a support function is used is not taken into consideration, and there is a problem in that the base substrate may be damaged.

One aspect of the present invention is directed to reducing damage on a base substrate by using the base substrate provided with a drive circuit driving a light emitting element in a step of separating off a growth substrate.

Solution to Problem

In order to solve the problem, according to an aspect the present invention, there is provided a semiconductor module including a base substrate that is provided with a drive circuit; and a plurality of light emitting elements that are electrically coupled to the drive circuit, in which a distance between the light emitting elements adjacent to each other is equal to or less than 20 µm in a top view.

According to another aspect of the present invention, there is provided a semiconductor module including a base substrate that is provided with a drive circuit; a plurality of light emitting elements that are electrically coupled to the drive circuit; and a semiconductor layer that shields a space between the light emitting elements adjacent to each other on an opposite side to the base substrate in a top view.

According to still aspect of the present invention, there is provided a semiconductor module including a base substrate that is provided with a drive circuit; and a plurality of light emitting elements that are electrically coupled to the drive circuit, in which a surface of each of the plurality of light emitting elements on an opposite side to the base substrate is formed in an uneven shape.

According to still aspect of the present invention, there is provided a semiconductor module including a base substrate that is provided with a drive circuit; a plurality of light emitting elements that are electrically coupled to the drive circuit; and a resin that fills a groove between the light emitting elements adjacent to each other.

According to still another aspect of the present invention, there is provided a semiconductor module including a base substrate that is provided with a drive circuit; a plurality of light emitting elements that are electrically coupled to the drive circuit; and a light shielding member or a light reflective member that shields a groove between the light emitting elements adjacent to each other on the base substrate side of the groove in a top view.

According to still another aspect of the present invention, there is provided a method of manufacturing a semiconductor module including a step of forming a plurality of light emitting elements from a semiconductor layer grown on a growth substrate; and a step of separating off the growth substrate from the plurality of light emitting elements through laser irradiation, in which the step of forming the plurality of light emitting elements includes a step of forming a distance between the light emitting elements adjacent to each other to be 0.1 µm or more and 20 µm or less in a top view, a laser light directed toward a base substrate during the laser irradiation passing between the light emitting elements, and in which the plurality of light emitting elements are electrically coupled to a drive circuit formed on the base substrate.

Advantageous Effects of Invention

According to one aspect of the present invention, it is possible to achieve an effect of reducing damage on a base substrate by using the base substrate provided with a drive circuit driving a light emitting element in a step of separating off a growth substrate.

BRIEF DESCRIPTION OF DRAWINGS (a) of FIG. 1 is a sectional view illustrating a sectional configuration of a semiconductor module according to Embodiment 1 of the present invention. (b) of FIG. 1 is a top view of the semiconductor module, and (c) of FIG. 1 is a sectional view of the semiconductor module illustrated in (b) of FIG. 1.

Figure 7:
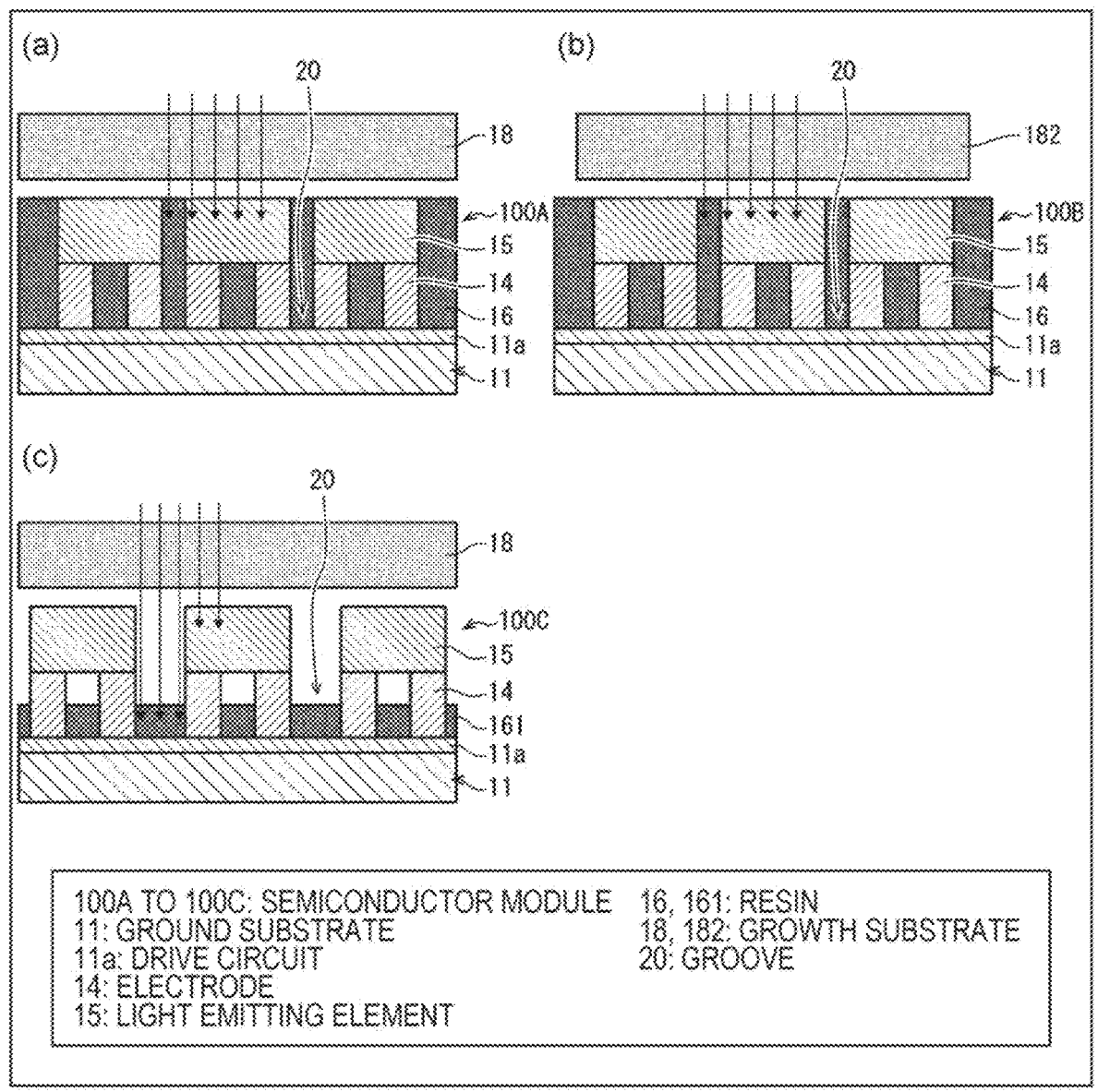

FIG. 7 is a sectional view illustrating a sectional configuration of the semiconductor module according to Embodiment 4 of the present invention. (a) of FIG. 7 is a diagram illustrating a configuration in which an area of a growth substrate is the same as an area of a resin in a top view, and (b) of FIG. 7 is a diagram illustrating a configuration in which an area of the growth substrate is smaller than an area of the resin in a top view. (c) of FIG. 7 is a diagram illustrating a configuration in which the resin is partially formed on the base substrate side.

Figure 8:
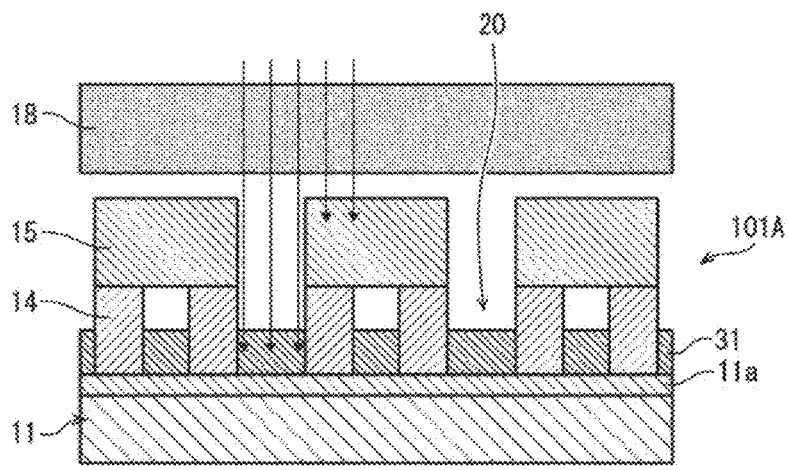

FIG. 8 is a sectional view illustrating a sectional configuration of a semiconductor module according to Embodiment 5 of the present invention.

Figure 9:
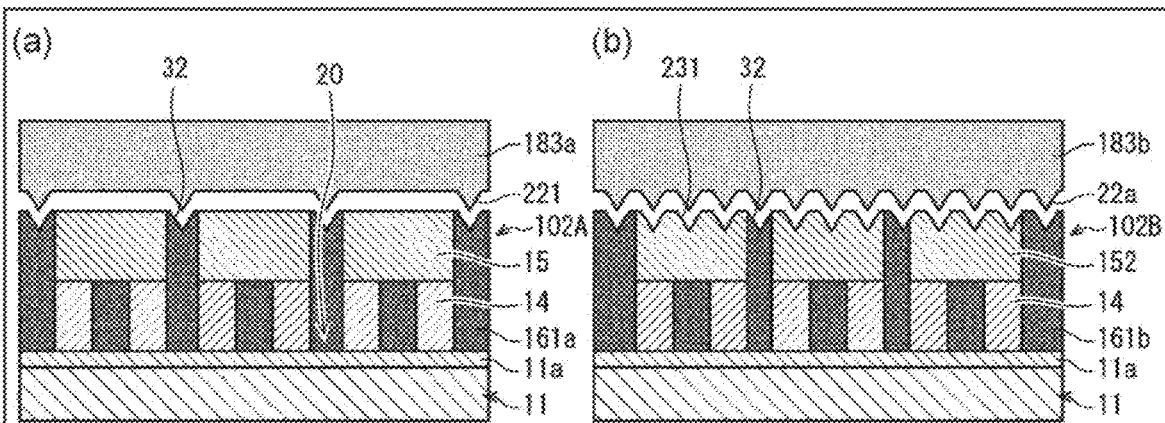

FIG. 9 is a sectional view illustrating a sectional configuration of a semiconductor module according to Embodiment 6 of the present invention. (a) of FIG. 9 is a diagram illustrating a configuration in which a resin is formed in an uneven shape, and (b) of FIG. 9 is a diagram illustrating a configuration in which a light emitting element and a resin are formed in an uneven shape.

Figure 10:
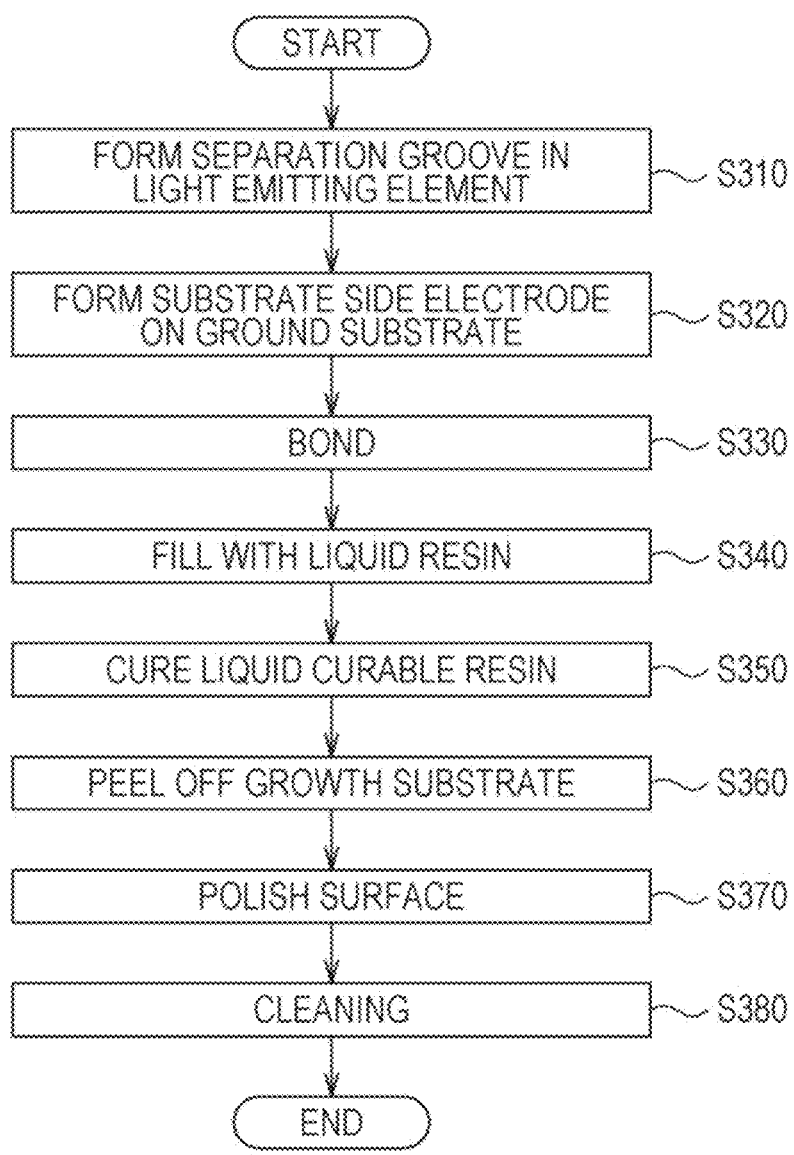

FIG. 10 is a flowchart for describing a method of manufacturing the semiconductor module according to Embodiment 6 of the present invention.

Figure 11:
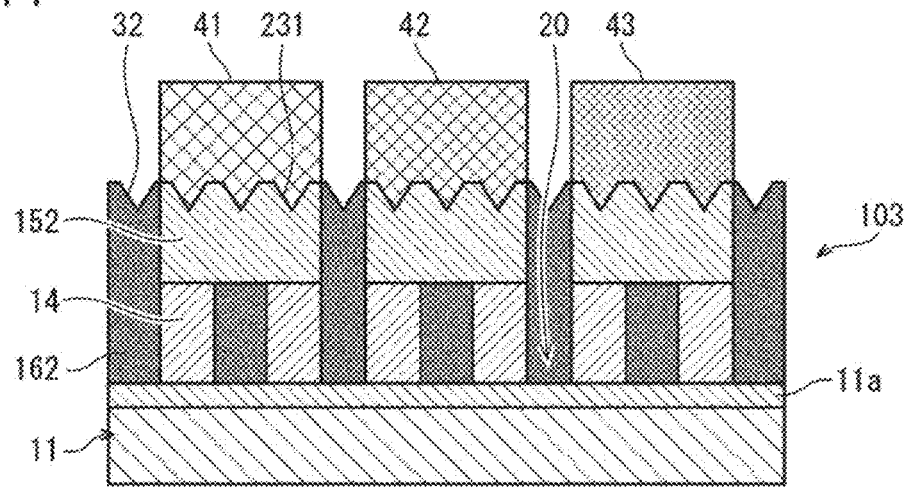

FIG. 11 is a sectional view illustrating a sectional configuration of a semiconductor module according to Embodiment 7 of the present invention.

Figure 12:
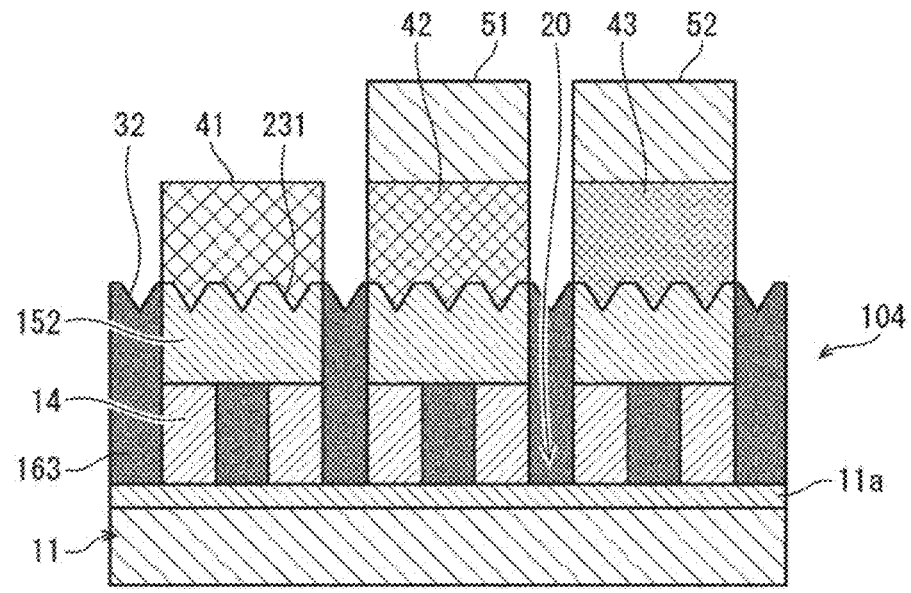

FIG. 12 is a sectional view illustrating a sectional configuration of a semiconductor module according to Embodiment 8 of the present invention.

Figure 13:
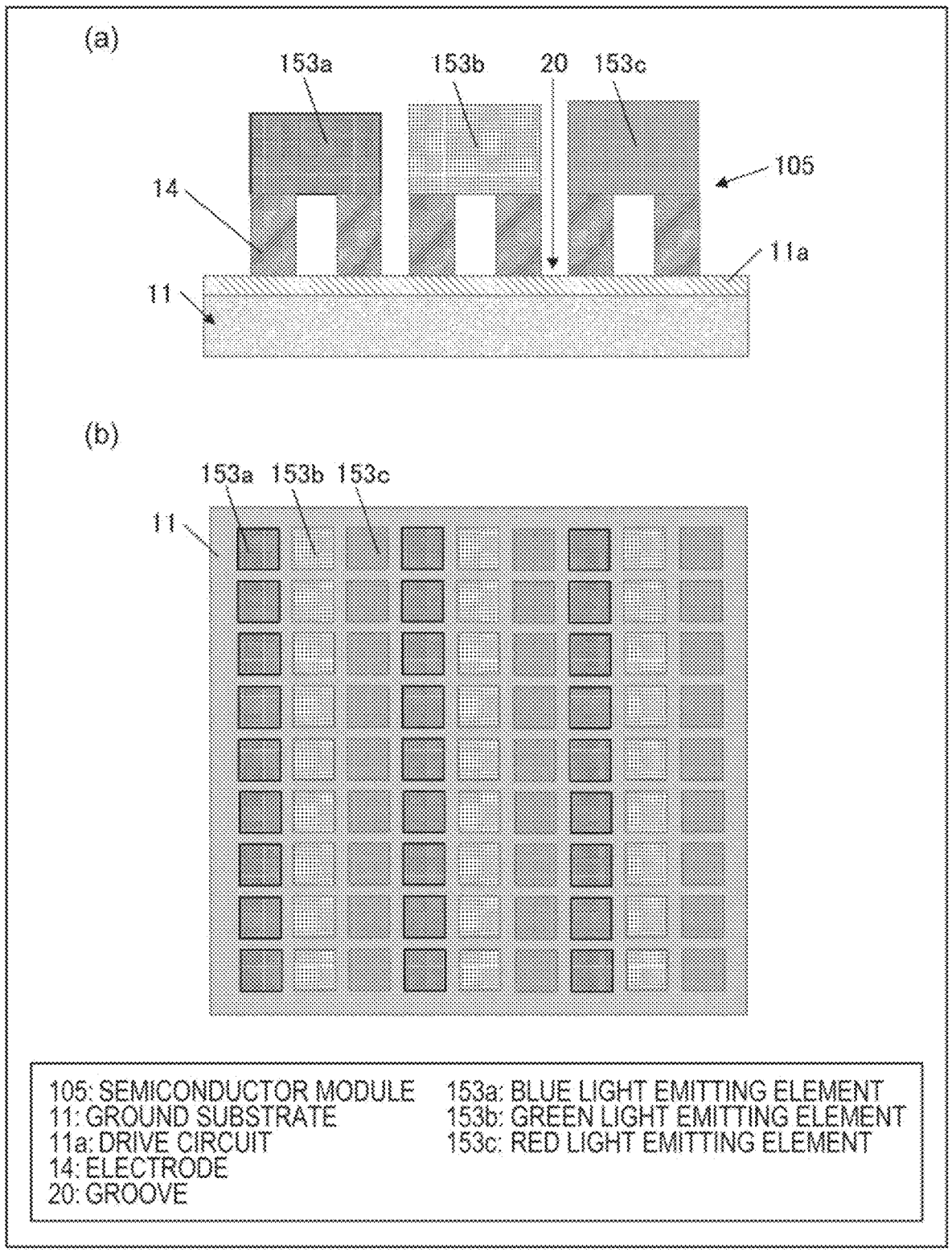

(a) of FIG. 13 is a sectional view illustrating a sectional configuration of a semiconductor module according to Embodiment 9 of the present invention, and (b) of FIG. 13 is a top view of the semiconductor module.

Figure 14:
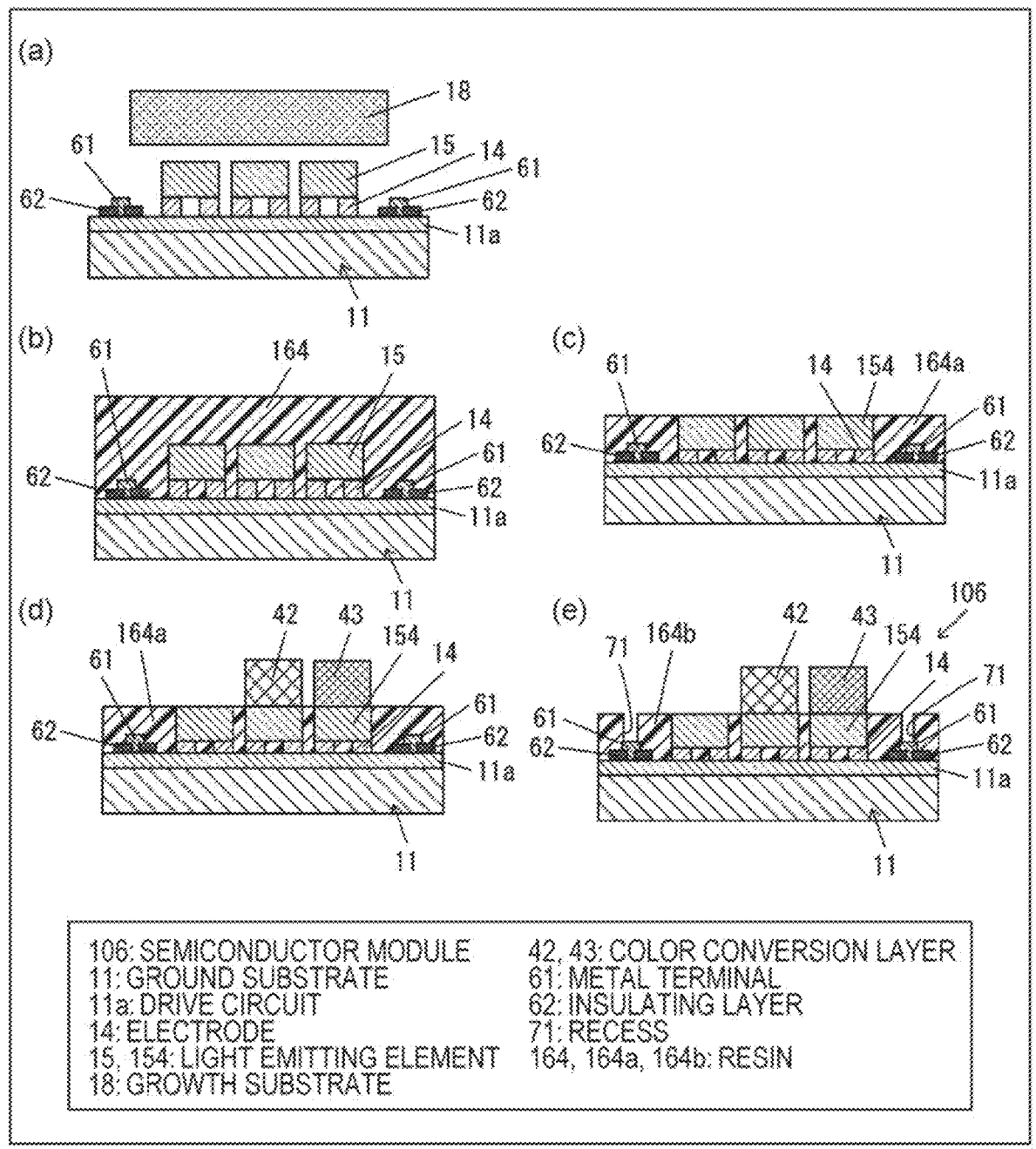

FIG. 14 is a diagram for describing a method of manufacturing a semiconductor module according to Embodiment 10 of the present invention.

Figure 15:
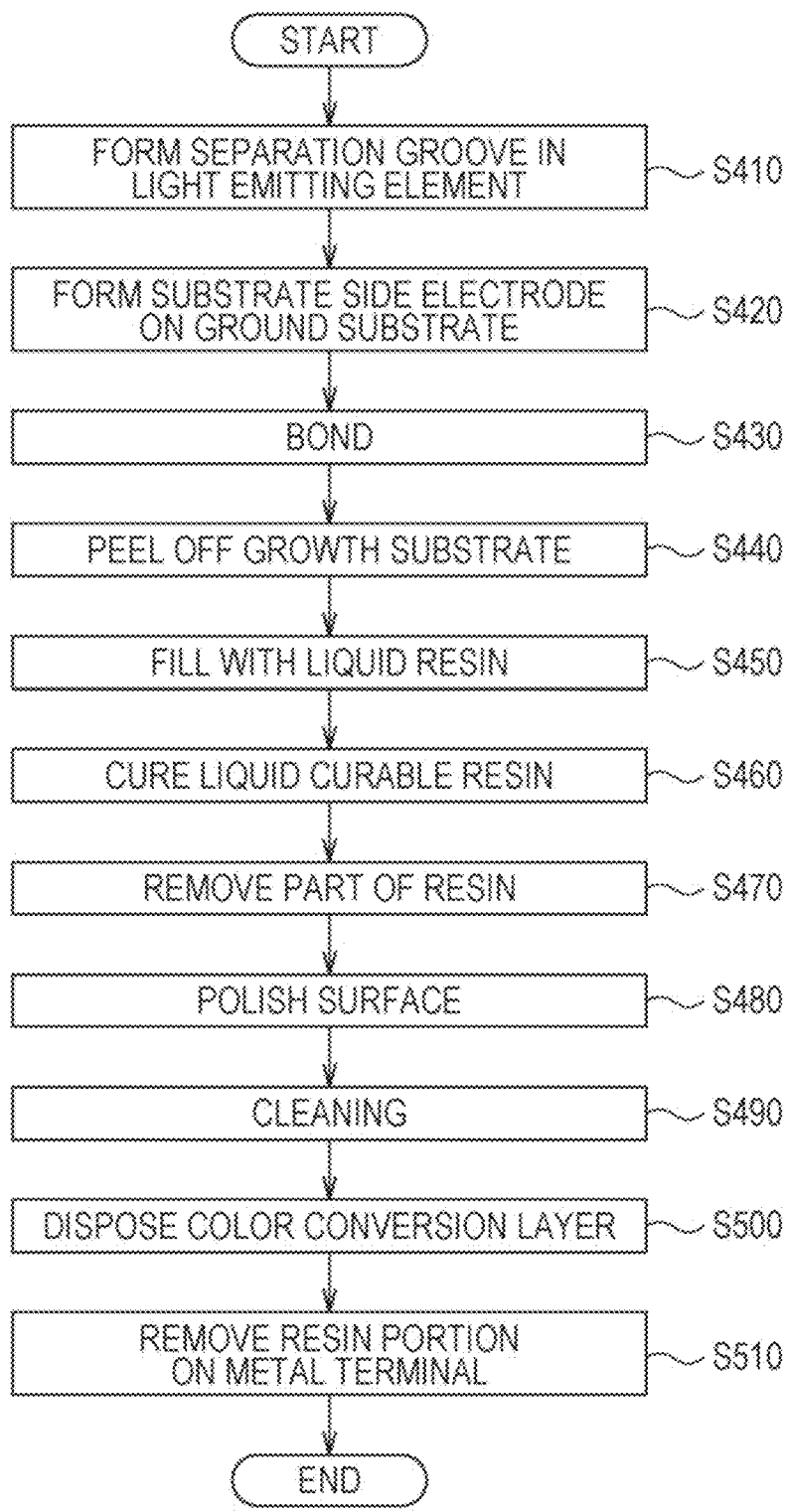

FIG. 15 is a flowchart illustrating the method of manufacturing the semiconductor module according to Embodiment 10 of the present invention.

DESCRIPTION OF EMBODIMENTS

Embodiment 1

Figure 1:
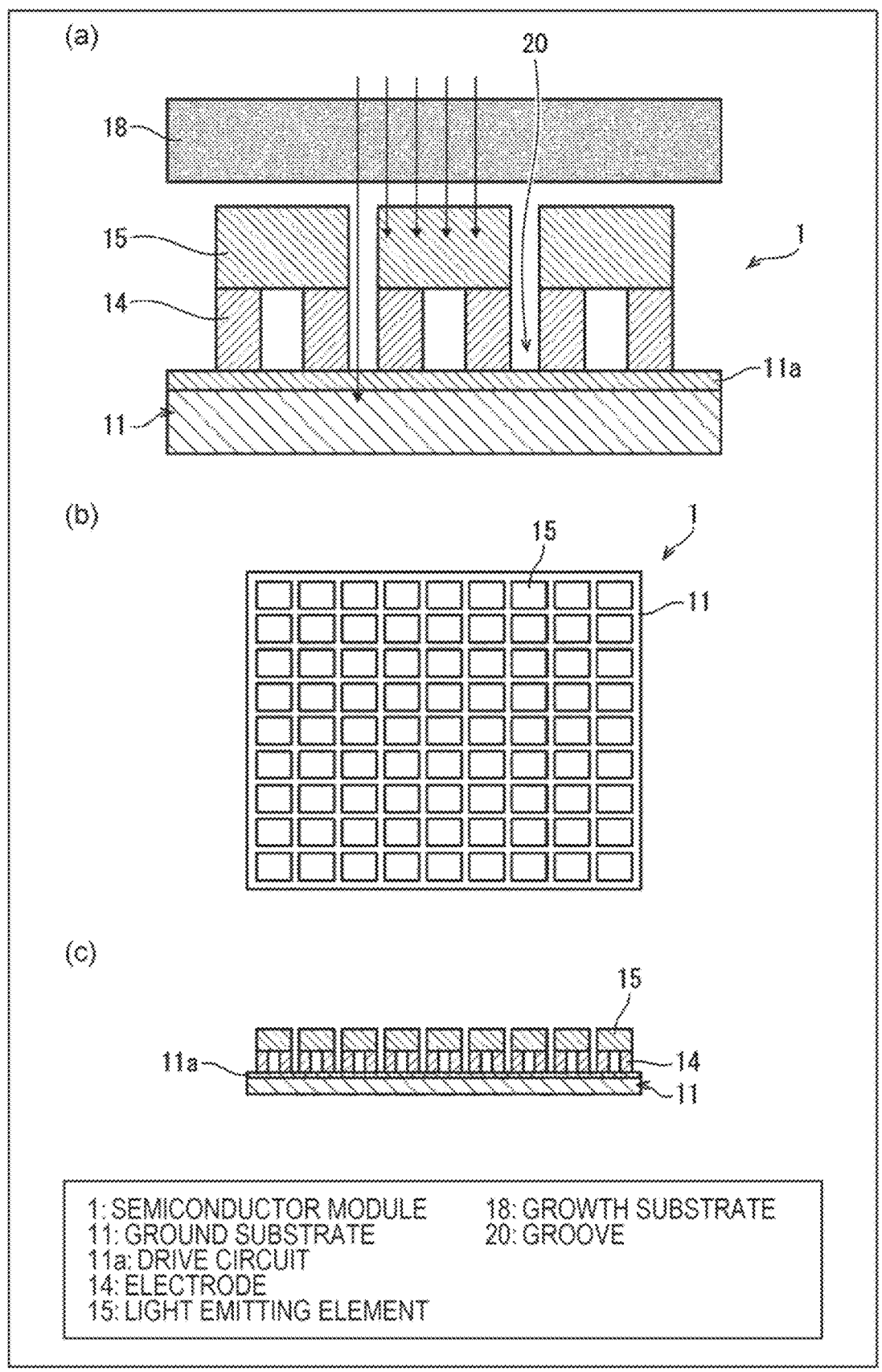
Figure 2:
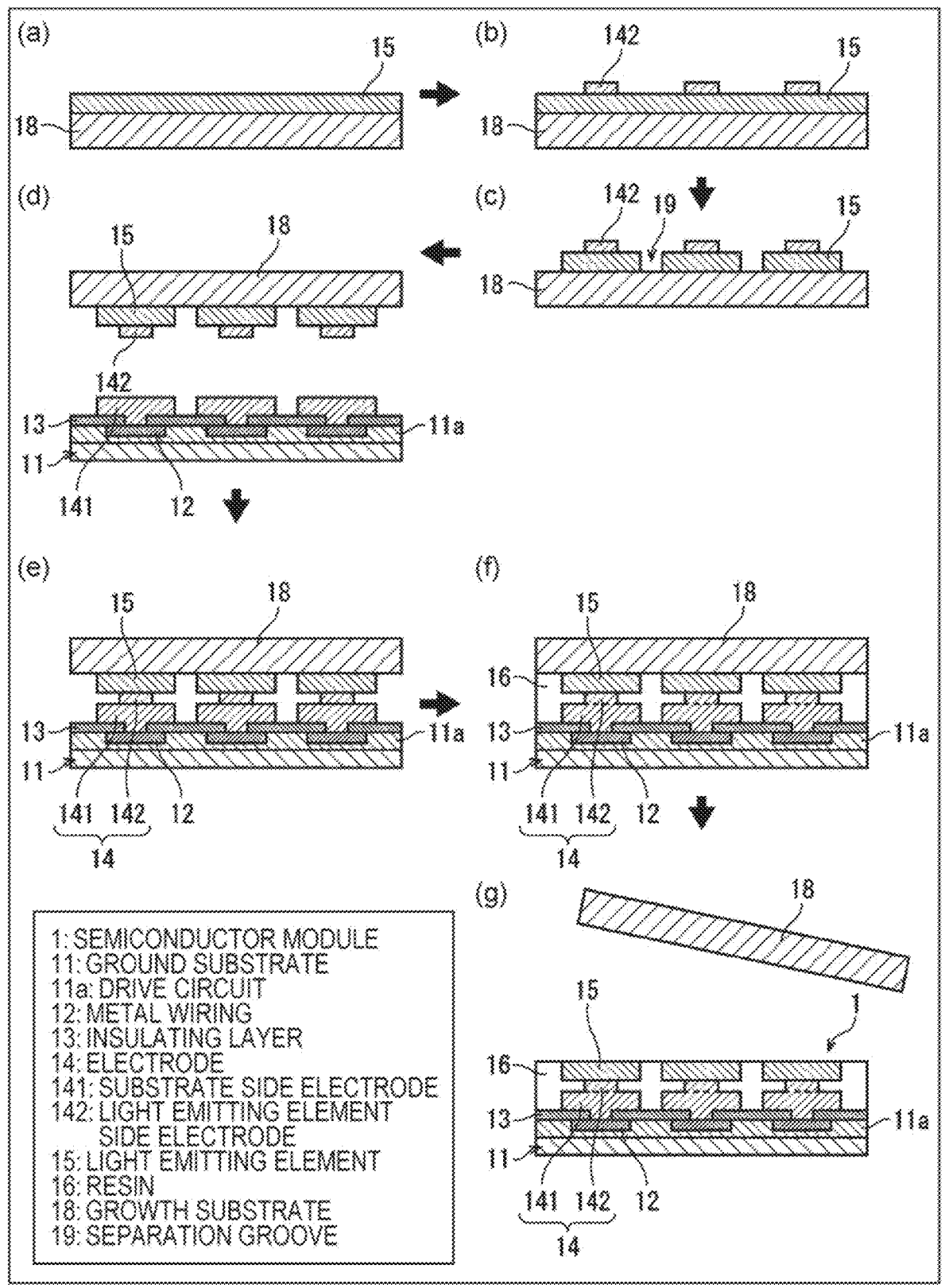
FIG. 2 is a diagram for describing a method of manufacturing the semiconductor module.
Figure 3:
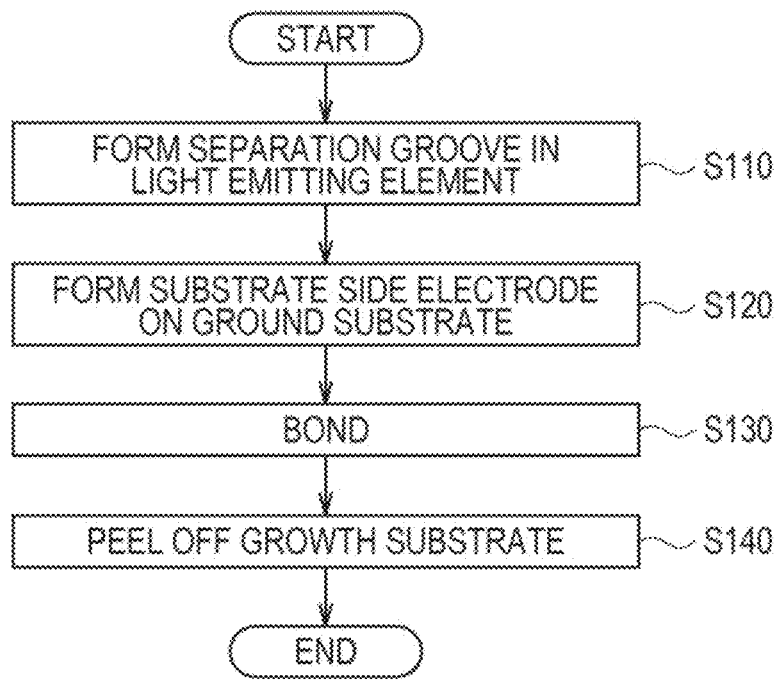
FIG. 3 is a flowchart for describing the method of manufacturing the semiconductor module according to Embodiment 1 of the present invention.

(a) of FIG. 1 is a sectional view illustrating a sectional configuration of a semiconductor module 1 according to Embodiment 1 of the present invention. (b) of FIG. 1 is a top view of the semiconductor module 1, and (c) of FIG. 1 is a sectional view of the semiconductor module 1 illustrated in (b) of FIG. 1. FIG. 2 is a diagram for describing a method of manufacturing the semiconductor module 1. FIG. 3 is a flowchart for describing the method of manufacturing the semiconductor module 1 according to Embodiment 1 of the present invention.

(Configuration of Semiconductor Module 1)

As illustrated in (g) of FIG. 2, the semiconductor module 1 includes a base substrate 11, metal wirings 12, insulating layers 13, electrodes 14, light emitting elements 15, and a resin 16. (a) of FIG. 1 is a simplified view of (f) of FIG. 2, and illustrates only the base substrate 11, the electrodes 14, the light emitting elements 15, and a growth substrate 18. As illustrated in (a) of FIG. 1, in the semiconductor module 1, the light emitting element 15 is provided on the base substrate 11 via the electrode 14. A groove 20 is provided between the light emitting elements 15 on the base substrate 11 side. The groove 20 is a space formed between the light emitting elements 15. In a step of separating off the growth substrate 18 which will be described later, a width of the groove 20 through which laser light directed toward the base substrate 11 passes during laser irradiation between the adjacent light emitting elements 15, that is, a distance between end surfaces of the adjacent light emitting elements 15 is 0.1 μm or more and 20 μm or less in a top view. In a case where the width of the groove 20 is equal to or less than 20 μm, an amount of laser light reaching the base substrate 11 side due to laser irradiation is reduced, and, thus, in the step of separating off the growth substrate 18 which will be described later, it is possible to reduce damage on the base substrate 11, the metal wiring 12, the insulating layer 13, and the electrode 14. In a case where the width of the groove 20 is small, electrostatic capacitances between the adjacent electrodes 14 and the adjacent light emitting elements 15 increase, and, thus, when a voltage is applied to the light emitting elements 15, electromotive force may be generated due to coupling noise between the adjacent electrodes 14. Consequently, accurate lighting control for the light emitting element 15 is inhibited, or a reverse voltage is applied to the light emitting element 15, and thus deterioration in the light emitting element 15 may occur. Therefore, the width of the groove 20 is preferably equal to or more than 0.1 μm. From the viewpoint of reliability of the semiconductor module 1, the light emitting element 15 is preferably maintained at a light emission intensity of 50% or more after being lighted for 1000 hours with respect to an initial light emission intensity at the time of being manufactured. In order to prevent deterioration in the light emitting element 15 due to a reverse voltage, the width of the groove 20 is preferably equal to or more than 0.1 μm.

The semiconductor module 1 is incorporated into a small-sized display apparatus such as a head mounted display or a display for a spectacle type device. A light emitting device provided in the display apparatus may be mounted with only a single semiconductor module 1, and may be mounted with a plurality of semiconductor modules 1. In the semiconductor module 1, the individual light emitting element 15 is disposed at a location corresponding to each pixel of a general display apparatus of the related art. The display apparatus includes the semiconductor module 1, and the display apparatus also include the semiconductor module in Embodiments 2 to 8 which will be described later.

As illustrated in (b) and (c) of FIG. 1, the semiconductor module 1 may be an array (structural body) in which the light emitting elements 15 are disposed in a lattice form of m×n (where m and n are natural numbers), and the light emitting elements may be disposed in a zigzag pattern or other patterns. In other words, a disposition form of the light emitting elements 15 is not particularly limited. The semiconductor module 1 controls lighting-on and lighting-off of each of the plurality of light emitting elements 15 by using a drive circuit 11a formed on the base substrate 11, and thus contributes to display of information in a display apparatus while realizing high contrast.

In the semiconductor module 1, a layout in which each light emitting element 15 is made small and the light emitting elements 15 are disposed in a dense state on the base substrate 11 is preferably used. Consequently, it is possible to improve a resolution of a display screen of a display apparatus. The present technique is a technique applicable to a product in which each of a vertical width and a horizontal width of the individual light emitting element 15 is 30 μm or less, and, more preferably, 2 μm to 15 μm in a top view.

(Base Substrate 11)

As the base substrate 11, a base substrate provided with a wiring such that at least a surface thereof is coupled to the light emitting element 15 may be used. The base substrate 11 has the drive circuit 11a driving the light emitting element 15. As a material of the base substrate 11, a crystalline substrate such as a single crystal or a polycrystal of aluminum nitride of which the whole is composed of aluminum nitride, and a sintered substrate are preferably used. As a material of the base substrate 11, a ceramic substrate such as alumina, a glass substrate, a semimetal substrate such as Si, or a metal substrate is preferably used, and a stacked body or a composite body in which an aluminum nitride thin layer is formed on a surface thereof may be used. The metal substrate and the ceramic substrate have high heat dissipation property and are thus preferably used.

For example, a base substrate in which the drive circuit 11a controlling light emission of the light emitting element 15 is formed on Si according to an integrated circuit formation technique is used as the base substrate 11, and thus it is possible to manufacture a high-resolution display apparatus in which the fine light emitting elements 15 are made dense.

(Metal Wiring 12)

The metal wiring 12 is a wiring including at least a control circuit supplying a control voltage to the light emitting element 15. The metal wiring 12 is formed by patterning a metal layer according to an ion milling method or an etching method. For example, the metal wiring 12 formed of a platinum thin film may be formed on a Si substrate surface. In order to protect the metal wiring 12, a protection film formed of a thin film of $SiO_2$ or the like may be formed on a surface of the base substrate 11 on a side on which the metal wiring 12 is formed.

(Insulating Layer 13)

The insulating layer 13 is an insulating layer formed of an oxide film, a resin film, and a resin layer. The insulating layer 13 prevents direct contact between the base substrate 11 and the electrode 14.

(Electrode 14)

The electrode 14 functions as a pad electrode electrically coupling the metal wiring 12 to a metal terminal (not illustrated) provided on the light emitting element 15, and is thus referred to as a bump. A first portion of the electrode 14 coupled to the metal wiring 12 is a substrate side electrode 141, and a second portion of the electrode 14 coupled to the metal terminal (not illustrated) provided on the light emitting element 15 is a light emitting element side electrode 142. The substrate side electrode 141 and the light emitting element side electrode 142 are made of any metal of Au, Pt, Pd, Rh, Ni, W, Mo, Cr, and Ti, alloys thereof, or a combination thereof. As examples of the combination, in a case where the substrate side electrode 141 and the light emitting element side electrode 142 are formed of metal electrode layers, a laminate structure such as W/Pt/Au, Rh/Pt/Au, W/Pt/Au/Ni, Pt/Au, Ti/Pt/Au, Ti/Rh, or TiW/Au from a lower surface may be used. The light emitting element side electrode 142 may be of a flip chip type in which an n-side electrode and a p-side electrode are formed on an identical surface side and are disposed on an opposite side to a light emitting surface of the light emitting element 15.

The electrode 14 has a step difference location in a light emission direction. An area of a section parallel to the light emission direction in the substrate side electrode 141 is different from an area of a section parallel to the light emission direction in the light emitting element side electrode 142. In (g) of FIG. 2, a sectional area of the substrate side electrode 141 is larger than a sectional area of the light emitting element side electrode 142. Outermost surfaces of the substrate side electrode 141 and the light emitting element side electrode 142 are preferably made of Au.

(Light Emitting Element 15)

As the light emitting element 15, a well-known light emitting element, for example, a semiconductor light emitting element may be used. For example, there is a GaAs-based semiconductor, a ZnO-based semiconductor, or a GaN-based semiconductor. As the light emitting element 15, a light emitting diode (LED) emitting red light, yellow light, green light, blue light, or violet light may be used, an LED emitting ultraviolet light may be used. Above all, the GaN-based semiconductor that can emit light from blue light to violet light or from violet light to ultraviolet light is preferably used as the light emitting element 15. The light emitting element 15 emits light from an upper surface thereof in (a) of FIG. 1. The upper surface of the light emitting element 15 is a light emitting surface. The light emitting element 15 is electrically coupled to the drive circuit 11a formed on the base substrate 11 via the electrode 14. The light emitting element 15 is coated with a phosphor that emits light with a color different from a color of light emitted from the light emitting element 15 when light is applied, and thus various light emission colors in a visible light region may be obtained. Thus, it is possible to emit short wavelength light that can be efficiently excited. The GaN-based semiconductor is preferably used for the light emitting element 15 in terms of having features such as high light emission efficiency, long service life, and high reliability.

As a semiconductor layer of the light emitting element 15, a nitride semiconductor has a feature of being in a short wavelength region of a visible light region, a near-ultraviolet region, or a shorter wavelength region than the near-ultraviolet region, and is thus preferably used for the semiconductor module 1 in which the feature is combined with a wavelength conversion member (phosphor). The light emitting element is not limited thereto, and a ZnSe-based semiconductor, an InGaAs-based semiconductor, or an AlInGaP-based semiconductor may be used.

A structure of the light emitting element using the semiconductor layer is preferably a structure having an active layer between a first conductivity type (n type) layer and a second conductivity type (p type) layer in terms of output efficiency, but is not limited thereto. An insulating, semi-insulating, and reverse conductivity type structures may be partially provided in each conductivity type layer, and may be additionally provided in the first and second conductivity type layers. Other circuit structures, for example, a protection element structure may be additionally provided.

In the present embodiment, as will be described later, the growth substrate 18 is separated off due to irradiation with laser light. In a case where the growth substrate 18 is present on the light emitting element 15 when the semiconductor module 1 is applied to a display apparatus, light emitted from the light emitting element 15 is diffused in the growth substrate 18, and thus high definition display is hardly performed. In contrast, in a case where the growth substrate 18 is not present on the light emitting element 15, light emitted from each light emitting element 15 is not diffused and is extracted, and thus a display apparatus can perform high definition display.

Structures of the light emitting element 15 and the semiconductor layer may include homo-structures, hetero-structures, or double hetero-structures having PN junction. Each layer may have a superlattice structure, and may have a single-quantum well structure or a multiple-quantum well structure in which a light emission layer that is an active layer is formed of a thin film causing a quantum effect. A metal terminal used to be supplied with power from an external device is provided on the light emitting element 15.

(Method of Manufacturing Semiconductor Module 1)

Next, a method of manufacturing the semiconductor module 1 will be described with reference to FIGS. 2 and 3.

(Step of Forming Light Emitting Element 15)

First, as illustrated in (a) of FIG. 2, the light emitting element 15 is provided on the growth substrate 18. The growth substrate 18 is a substrate epitaxially growing a semiconductor layer of the light emitting element 15. A light emitting element structure of the light emitting element 15 is formed by sequentially depositing different layers according to a metal organic chemical vapor deposition (MOCVD) method or a molecular beam epitaxy (MBE) method. As the growth substrate 18 using a nitride semiconductor, there is an insulating substrate containing, for example, sapphire ($Al_2O_3$) or spinel ($MgAl_2O_4$) that has any one of a C face, an R face, and an A face as a principal face. As the growth substrate 18 using a nitride semiconductor, there is an oxide substrate containing, for example, lithium niobate or neodymium gallate in lattice junction with silicon carbide (6H, 4H, 3C), Si, ZnS, ZnO, GaAs, diamond, and a nitride semiconductor. As the growth substrate 18 using a nitride semiconductor, there is a nitride semiconductor substrate containing, for example, GaN or AlN.

For example, in a case where the GaN-based light emitting element 15 is manufactured according to the MOCVD method by using a sapphire substrate as the growth substrate 18, the growth substrate 18 may be a patterned sapphire substrate (PSS). The PSS is a substrate in which an uneven portion with a size of several μm is formed at a pitch of several μm on a surface of the growth substrate 18 on which a GaN layer is deposited. An inclined structure is formed on a light emitting surface of the light emitting element 15 by the fine uneven portion, and thus realizes a function of improving light extraction efficiency in the light emitting element 15 and a function of reducing a structural defect in the light emission layer of the light emitting element 15. Consequently, it is possible to provide the light emitting element 15 emitting light with high efficiency. The uneven portion of the PSS is made of $Al_2O_3$, AlN, or GaN. A case is assumed in which the uneven portion is made of $Al_2O_3$ that is the same composition as that of the growth substrate 18. In this case, a photoresist mask is formed on the growth substrate 18, and then the uneven portion is formed according to inductively coupled plasma (ICP) dry etching or the like. In order to alleviate lattice mismatch between $Al_2O_3$ and GaN, AlN or the like may be deposited on $Al_2O_3$. A shape of the uneven portion of the PSS is not limited but is generally a substantially conical shape, and it is preferable that a diameter of a bottom of the substantially conical shape is 3 μm or less, a height thereof is 2 μm or less, and an angle of a vertex thereof is in a range from 60° to 120°. A thickness of the growth substrate 18 is in a range from 20 μm to 1000 μm. The thickness is a thickness along a direction directed from the base substrate 11 toward the growth substrate 18. In a case where the thickness of the growth substrate 18 is small, a risk of the growth substrate 18 being broken during manufacturing steps becomes high, and thus the thickness of the growth substrate 18 is preferably equal to or more than 20 μm. On the other hand, in a case where the thickness of the growth substrate 18 is large, there is a high probability that a bending state of the growth substrate 18 may increase after the light emitting element 15 is formed, and thus there is a high probability that the light emitting element 15 with high light emission efficiency may not be formed. Thus, the thickness of the growth substrate 18 is preferably equal to or less than 1000 μm.

The nitride semiconductor has $In_xAl_yGa_{1-x-y}N$ (where 0≤x, 0≤y, and x+y≤1) as a general formula, and may be mixed with B, P, or As. Each of an n-type semiconductor layer and a p-type semiconductor layer of the light emitting element 15 is not particularly limited to a single layer or multiple layers. The nitride semiconductor layer has a light emission layer that is an active layer, and the active layer has a single-quantum well (SQW) structure or a multiple-quantum well (MQW) structure.

A ground layer of a nitride semiconductor such as a buffer layer, for example, an n-type contact layer of Si-doped GaN and an n-type multilayer film layer of GaN/InGaN are laminated as n-type nitride semiconductor layers on the growth substrate 18 via, for example, low temperature grown thin film GaN layer and GaN layer. Successively, an active layer of MQW of InGaN/GaN is laminated, and a structure in which, for example, a p-type multilayer film layer of Mg-doped InGaN/AlGaN and a p-type contact layer of Mg-doped GaN are laminated on each other is used as p-type nitride semiconductor layers. The light emission layer (active layer) of the nitride semiconductor has a quantum well structure including, for example, a barrier layer and a well layer. A nitride semiconductor used for the active layer may be doped with a p-type impurity, but is preferably not doped or doped with an n-type impurity such that output of the light emitting element 15 can be increased.

Since the well layer contains Al, a wavelength shorter than a wavelength of 365 nm that is the bandgap energy of GaN can be obtained. A wavelength of light emitted from the active layer is set to about 360 nm or more and 650 nm or less, and, preferably, to 380 nm or more and 560 nm or less, according to a purpose and an application of a light emitting element. A composition of the well layer is InGaN that is preferably used in the visible light region and/or the near-ultraviolet region, and a composition of the barrier layer in this case may be GaN or InGaN. Specific examples of film thicknesses of the barrier layer and the well layer are respectively 1 nm or more and 30 nm or less, and 1 nm or more and 20 nm or less, and a multiple-quantum well structure of a plurality of well layers using a single-quantum well of a single well layer and a barrier layer may be employed.

(Mesa Formation Step)

After the light emitting element 15 is formed, the n-type GaN layer is exposed to a part of a surface of the p-type contact layer included in the light emitting element 15 through etching, and thus a mesa is formed. The etching may be performed by using a well-known photolithography method. An n-side electrode is formed in the exposed n-type GaN layer in the subsequent steps.

(Step of Forming Light Emitting Element Side Electrode 142)

After the mesa is formed, as illustrated in (b) of FIG. 2, a plurality of light emitting element side electrodes 142 are formed on the light emitting element 15. The formation is performed according to a well-known general electrode formation technique. A representative material of the light emitting element side electrode 142 is, for example, Au.

(Step of Forming Dividing Groove 19)

After the light emitting element side electrode 142 are formed, as illustrated in (c) of FIG. 2, a plurality of dividing grooves 19 are formed in the light emitting element 15 (step S110). A standard semiconductor selective etching process is used to form the dividing grooves 19. In (c) of FIG. 2, the dividing groove 19 is formed between the light emitting element side electrodes 142 adjacent to each other. The formed dividing groove 19 reaches up to the surface of the growth substrate 18. The dividing grooves 19 are formed, and thus the single light emitting element 15 is divided into a plurality of individual light emitting elements 15 (chip) on the surface of the growth substrate 18. The dividing groove 19 is formed such that a width of the dividing groove 19 is in a range from 0.1 µm to 20 µm. In a case where the width of the dividing groove 19 is equal to or less than 20 µm, an amount of laser light reaching the base substrate 11 side is reduced, and, thus, in a step of separating off the growth substrate 18 which will be described later, it is possible to reduce damage on the base substrate 11, the metal wiring 12, the insulating layer 13, and the electrode 14. On the other hand, in a case where the width of the dividing groove 19 is small, electrostatic capacitances between the adjacent electrodes 14 and the adjacent light emitting elements 15 increase, and, thus, when a voltage is applied to the light emitting elements 15, electromotive force may be generated due to coupling noise between the adjacent light emitting elements 15. Consequently, accurate lighting control for the light emitting element 15 is inhibited, or a reverse voltage is applied to the light emitting element 15, and thus deterioration in the light emitting element 15 may occur. Therefore, the width of the dividing groove 19 is preferably equal to or more than 0.1 µm. From the viewpoint of reliability of the semiconductor module 1, the light emitting element 15 is preferably maintained at a light emission intensity of 50% or more after being lighted for 1000 hours with respect to an initial light emission intensity at the time of being manufactured. In order to prevent deterioration in the light emitting element 15 due to a reverse voltage, the width of the dividing groove 19 is preferably equal to or more than 0.1 µm.

(Step of Smoothing Growth Substrate 18)

In the step of separating off the growth substrate 18 which will be described later, it is necessary to uniformly irradiate a separated surface with laser light. Thus, it is desirable to perform a step of smoothing a surface other than the surface of the growth substrate 18 on which the light emitting elements 15 are formed, through polishing or the like. A thickness of the growth substrate 18 after being smoothed through polishing or the like is preferably in a range from 20 µm to 400 µm. In a case where the thickness of the growth substrate 18 is small, a risk of the growth substrate 18 being broken during manufacturing steps becomes high, and thus the thickness of the growth substrate 18 is preferably equal to or more than 20 µm. On the other hand, in a case where the thickness of the growth substrate 18 is large, there is a high probability that a bending state of the growth substrate 18 may increase. Consequently, there is a high probability that the light emitting element 15 with high light emission efficiency may not be formed, and it is difficult to perform a bonding step with the base substrate 11 which will be described later, or there is a low probability that laser light applied to separate off the growth substrate 18 may be uniformly incident to a separated surface. Thus, the thickness of the growth substrate 18 is preferably equal to or less than 400 µm. The smoothing step may be performed after an array dividing step which will be described later.

(Step of Dividing Growth Substrate 18)

The light emitting elements 15 are formed on the wafer-like growth substrate 18, and may be subjected to a step of being divided into light emitting element pieces on which one or more light emitting elements 15 are mounted. The light emitting element piece may be a piece on which a single light emitting element array is mounted, and may be a piece on which a plurality of light emitting element arrays are mounted. Regarding the light emitting element piece, a plurality of pieces may form a single light emitting element array. Here, the light emitting element array includes light emitting elements of the number corresponding to a single constituent unit of the drive circuit 11a of the base substrate 11. As described above, m×n light emitting elements are mounted on the semiconductor module 1. The growth substrate 18 may be divided through dicing or the like. Particularly, in a case where a size of the growth substrate 18 is different from a size of the base substrate 11, preferably, the step of dividing the growth substrate 18 is performed, and then bonding with the base substrate 11 is performed. The growth substrate 18 may be bonded to the base substrate 11 in a wafer-like state without dividing the growth substrate 18.

(Step of Aligning Two Substrates)

After the dividing grooves 19 are formed, as illustrated in (d) of FIG. 2, the base substrate 11 on which the metal wirings 12, the insulating layer 13, and the substrate side electrodes 141 are formed in advance is prepared. The substrate side electrodes 141 are formed on the base substrate 11 according to a well-known general electrode formation technique. The substrate side electrodes 141 are formed on the base substrate 11 (step S120). A representative material of the substrate side electrode 141 is, for example, Au. The growth substrate 18 is reversed as illustrated in (d) of FIG. 2 in parallel to the preparation of the base substrate 11. After reversion, the base substrate 11 and the growth substrate 18 are aligned with each other such that the substrate side electrodes 141 respectively face the light emitting element side electrode 142.

(Step of Bonding Substrates)

After alignment is completed, as illustrated in (e) of FIG. 2, the base substrate 11 and the growth substrate 18 are bonded to each other (step S130). In this case, the base substrate 11 and the growth substrate 18 suppressed from above and below through pressurization such that the substrate side electrode 141 and the light emitting element side electrode 142 corresponding to each other are joined together by using an existing bonding technique. Consequently, the corresponding substrate side electrode 141 and light emitting element side electrode 142 are integrated into the electrode 14. The base substrate 11 may be bonded in a wafer-like state, and may be bonded after the base substrate 11 is divided. A step of forming the resin 16 as illustrated in (f) of FIG. 2 is not performed in the present embodiment. On the other hand, the step of forming the resin 16 as illustrated in (f) of FIG. 2 is performed in Embodiments 4, 6, 7, and 8 which will be described later. In Embodiment 5 which will be described later, a light shielding member 31 is formed instead of the resin 16.

(Step of Separating Off Growth Substrate 18)

After bonding is completed, as illustrated in (g) of FIG. 2, the growth substrate 18 is separated off (step S140). However, as described above, in the present embodiment, the step of forming the resin 16 as illustrated in (f) of FIG. 2 is not performed, and thus the resin 16 is not present. In this step, as an example of separating means, a separating technique using irradiation with laser light may be used. For example, in a case where a transparent substrate such as a sapphire substrate is used for the growth substrate 18, and a nitride semiconductor is subjected to crystal growth as a light emitting element layer, laser light is applied from the transparent substrate side under a predetermined condition, and thus it is possible to reduce damage on an interface between the growth substrate 18 and a crystal growth layer. The growth substrate 18 is separated off, and thus the light emitting element 15 has a structure in which the growth substrate 18 is separated off from the semiconductor layer grown on the growth substrate 18 due to laser irradiation. A wavelength of the laser light is not particularly limited in a range from 200 nm to 1100 nm, but is required to be a wavelength at which the growth substrate 18 can be separated off, that is, light is absorbed by the growth substrate 18.

As illustrated in (a) of FIG. 1, since the width of the groove 20 formed between the light emitting elements 15 is 0.1 μm or more and 20 μm or less, in the step of separating off the growth substrate 18, the intensity of laser light reaching the base substrate 11 is low during irradiation with the laser light. Thus, it is possible to reduce damage on the base substrate 11 due to the step of separating off the growth substrate 18.

In the semiconductor module 1 of the present embodiment, it is possible to reduce a problem that the drive circuit 11a of the base substrate 11 is not normally operated due to damage on the base substrate 11, and thus all of the light emitting elements 15 or some of the light emitting elements 15 do not emit light. Here, the damage on the base substrate 11 includes damage on the base substrate 11, and melting or burning of the metal wiring 12, the insulating layer 13, and the electrode 14 formed on the base substrate 11. Due to the damage on the base substrate 11, elements such as a transistor, a diode, and/or a capacitor used in the drive circuit 11a formed on the base substrate 11 may not be operated. Due to the damage on the base substrate 11, characteristics of the elements may change. Due to the damage on the base substrate 11, there may be the occurrence of a problem that a letter, a symbol, a number, or an image is not clearly displayed on a display screen of a display apparatus.

After the growth substrate 18 is separated off, the light emitting surface of the light emitting element 15 is exposed. Consequently, manufacturing of the semiconductor module 1 is completed. The damage on the base substrate 11 in the step of separating off the growth substrate 18 indicates damage on the metal wiring 12 formed on the base substrate 11 and damage on the insulating layer 13 formed on the base substrate 11. In the present embodiment, the drive circuit 11a of the base substrate 11 is prevented from not being normally operated due to the damage on the base substrate 11.

The manufacturing method is only an example of a method causing the semiconductor module 1 to be manufactured. Each step described herein is for enabling the semiconductor module 1 to be easily manufactured, and steps forming a method of manufacturing the semiconductor module 1 are not limited thereto. For example, for a plurality of light emitting elements 15, only the single type is not used, and a plurality of types may be combined with each other, and a red LED and a green LED may be formed together as a plurality of light emitting elements 15.

A blue LED, a green LED, and a red LED may be used as a plurality of light emitting elements 15. As the blue LED, the light emitting element 15 from which a part of the growth substrate 18 or the whole of the growth substrate 18 is separated off may be used. In the semiconductor module 1, the blue LED, the green LED, and the red LED may be mounted on the drive circuit 11a. Each of is the blue LED, the green LED, and the red LED electrically coupled to the drive circuit 11a.

Embodiment 2

Figure 4:
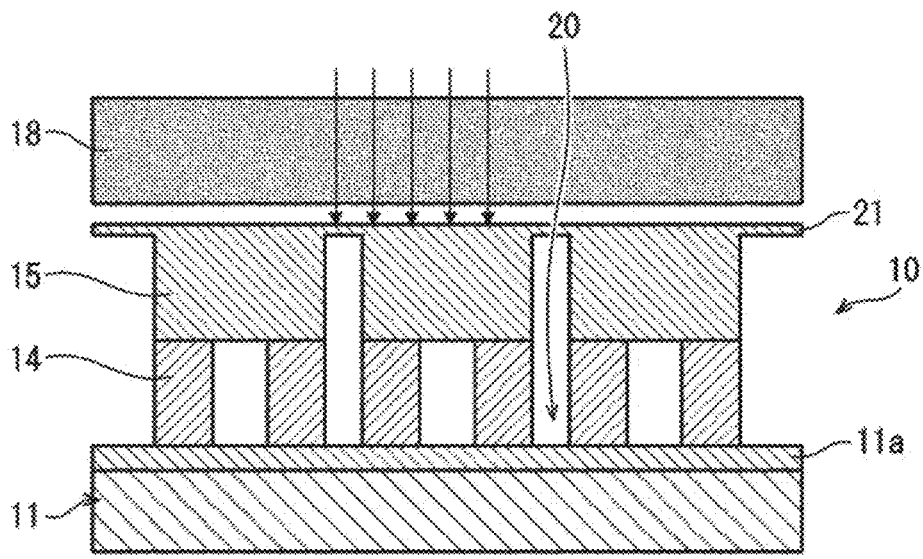
FIG. 4 is a sectional view illustrating a sectional configuration of a semiconductor module according to Embodiment 2 of the present invention.

FIG. 4 is a sectional view illustrating a sectional configuration of a semiconductor module 10 according to Embodiment 2 of the present invention. For convenience of description, a member having the same function as that of the member described in the embodiment will be given the same reference numeral, and description thereof will not be repeated.

As illustrated in FIG. 4, in the semiconductor module 10, a thin GaN film 21 (a semiconductor layer or a nitride semiconductor layer) remains on the light emitting elements 15 compared with the semiconductor module 1. In other words, the semiconductor module 10 includes the base substrate 11, the electrodes 14, the light emitting elements 15, and the GaN film 21. In this case, only the GaN film 21 is not required to remain, and other layers of the light emitting element 15 may remain in addition to the GaN film 21. At least parts of the light emitting surfaces of a plurality of adjacent light emitting elements 15 are coupled to each other via the GaN film 21. In other words, the GaN film 21 remains to shield the groove 20 in a top view on the growth substrate 18 side of the groove 20 through which laser light directed toward the base substrate 11 passes during laser irradiation in the step of separating off the growth substrate 18. The GaN film 21 has a light emitting surface on the growth substrate 18 side, and the plurality of light emitting elements 15 share a single light emitting surface. Consequently, when the growth substrate 18 is separated off due to irradiation with laser light, the GaN film 21 absorbs the laser light, and thus it is possible to reduce damage on the base substrate 11 provided with the drive circuit 11a. A surface of the semiconductor module 10 on the growth substrate 18 side can be further smoothed.

The semiconductor module 10 is manufactured as follows, for example. In a step of forming the dividing groove 19, the dividing groove 19 does not reach up to the growth substrate 18, and the dividing groove 19 is formed such that the GaN film 21 that is formed through epitaxial growth slightly remains on the surface of the growth substrate 18. For example, the dividing groove 19 is formed such that only 1 μm of the GaN film 21 remains on the surface of the growth substrate 18. Therefore, the dividing groove 19 is formed such that the GaN film 21 slightly remains on the surface of the growth substrate 18. A thickness of the GaN film 21 is preferably 0.1 μm or more and 3 μm or less. The thickness is a thickness along a direction directed from the base substrate 11 toward the growth substrate 18. Since a depth at which laser light can be transmitted through the GaN film 21 is about 0.1 μm, the thickness of the GaN film 21 is preferably equal to or more than 0.1 μm. On the other hand, in a case where the GaN film 21 is too thick, blue light applied from the light emitting element 15 propagates through the GaN film 21. Consequently, since the light also reaches the light emitting element 15 that is located around the lighted light emitting element 15 and is not lighted, a display apparatus hardly performs high definition display. In order to reduce the influence of light propagation in the GaN film 21, the thickness of the GaN film 21 is preferably equal to or less than 3 μm. Consequently, in the step of separating off the growth substrate 18, for example, when the growth substrate 18 is separated off through laser irradiation, the GaN film 21 can be brought into a state of remaining as a thin layer in the semiconductor module 10 as illustrated in FIG. 4 instead of the GaN film 21 being decomposed. Consequently, when the growth substrate 18 is separated off through laser irradiation, the GaN film 21 absorbs laser light, and thus it is possible to reduce damage on the base substrate 11 provided with the drive circuit 11a. During manufacturing of the semiconductor module 10, the surface of the semiconductor module 10 on the growth substrate 18 side can be further smoothed.

As illustrated in FIG. 4, all of the light emitting elements 15 are connected to each other via the GaN film 21, but the electrode 14 is formed to cause the individual light emitting element 15 to emit light, and thus image display using the semiconductor module 10 is possible.

As mentioned above, in the semiconductor module 10, a plurality of light emitting elements 15 are connected to each other via the GaN film 21, and thus it is possible to reduce damage on the base substrate 11 while high definition display performance is maintained. Thus, it is possible to improve product quality of the semiconductor module 10.

Embodiment 3

Figure 5:
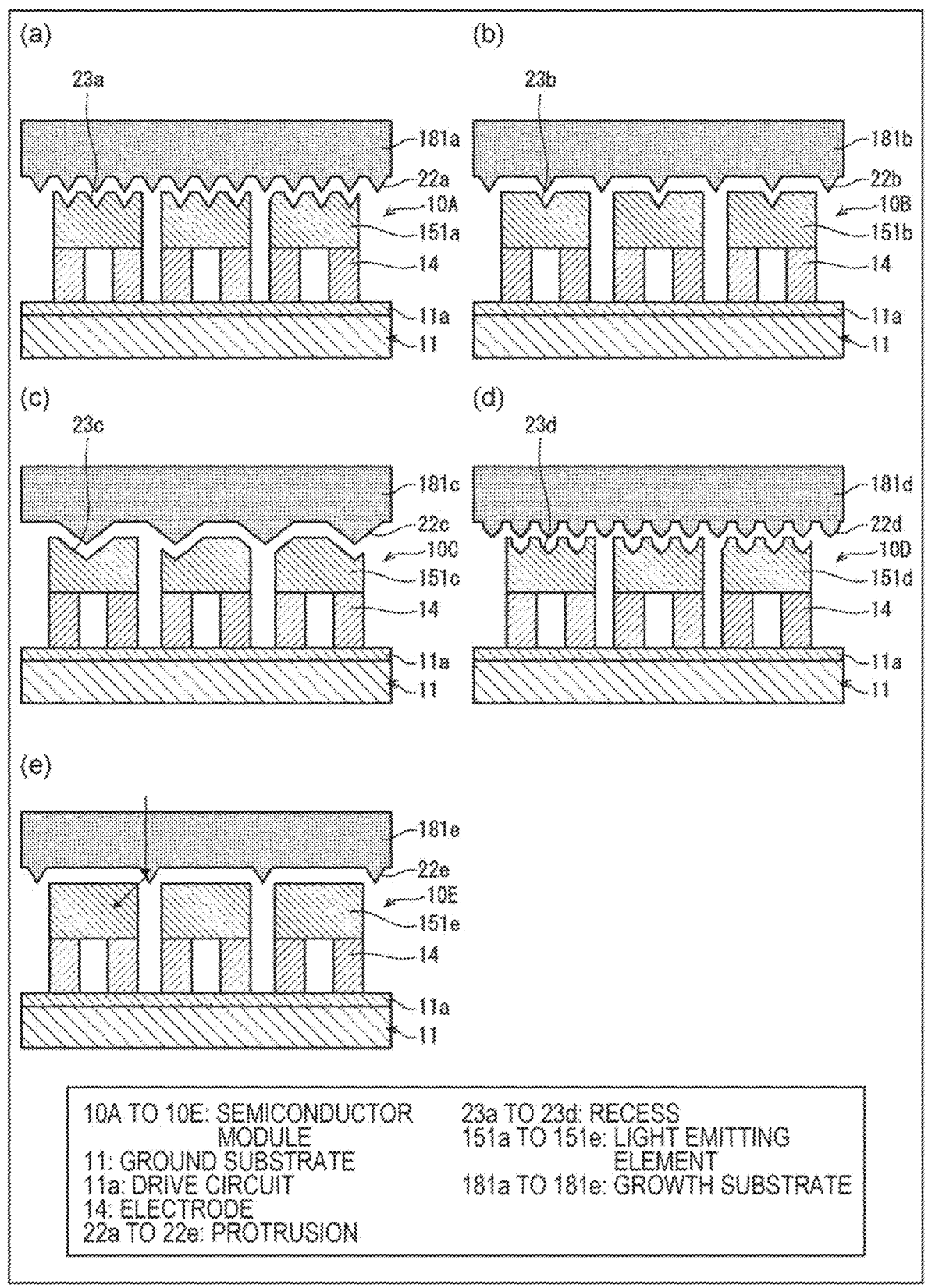
FIG. 5 is a sectional view illustrating a sectional configuration of a semiconductor module according to Embodiment 3 of the present invention. (a) to (e) of FIG. 5 are diagrams illustrating a case where a surface of a growth substrate is formed in an uneven shape.

FIG. 5 corresponds to sectional views illustrating sectional configurations of semiconductor modules 10A to 10E according to Embodiment 3 of the present invention. (a) to (e) of FIG. 5 are diagrams illustrating a case where surfaces of growth substrates 181a to 181e are formed in an uneven shape. For convenience of description, a member having the same function as that of the member described in the embodiments will be given the same reference numeral, and description thereof will not be repeated.

As illustrated in (a) of FIG. 5, a semiconductor module 10A is different from the semiconductor module 1 in that a shape of a light emitting element 151a is different from a shape of the light emitting element 15. A surface of a growth substrate 181a on the base substrate 11 side is formed in an uneven shape, and is provided with protrusions 22a. For example, each of the protrusions 22a each has a substantially conical shape, and are formed at an equal interval. When the growth substrate 181a is separated off through laser irradiation, each of light emitting surfaces (surfaces on the growth substrate 181a side) of a plurality of light emitting elements 151a is formed in an uneven shape, and a plurality of recesses 23a are formed on the light emitting surface of a single light emitting element 151a at an equal interval. In other words, when the light emitting element 151a is combined with the growth substrate 181a, the recess 23a is formed by the protrusion 22a. The recess 23a has a tapered shape toward the base substrate 11.

As mentioned above, since the surface of the growth substrate 181a on the base substrate 11 side is formed in an uneven shape, when the growth substrate 181a is separated off through laser irradiation, laser light is diffracted and scattered on a surface of the protrusion 22a of the growth substrate 181a. The scattered laser light is almost absorbed by GaN that is a main component of the light emitting element 151a. Consequently, an amount of the laser light reaching the base substrate 11 is small, and thus it is possible to reduce damage on the base substrate 11. When a manufacturing step for implementing a configuration of the semiconductor module 10A is taken into consideration, the surface of the growth substrate 181a on the base substrate 11 side is preferably formed in an uneven shape. This is because laser light is diffracted and scattered on the surface of the protrusion 22a of the growth substrate 181a such that an amount of the laser light reaching the base substrate 11 is small, and thus it is possible to reduce damage on the base substrate 11.

The light emitting surface of the light emitting element 151a is formed in an uneven shape, and thus it is possible to improve efficiency of extracting light from the light emitting element 151a. The uneven shape may be formed by using the growth substrate 181a such as a PSS having an uneven shape when the light emitting element 151a is formed.

As mentioned above, in the semiconductor module 10A, since damage on the base substrate 11 can be reduced, and the efficiency of extracting light from the light emitting element 151a can be improved, it is possible to improve product quality of the semiconductor module 10A. The same effect may be achieved for semiconductor modules 10B to 10E which will be described later.

As illustrated in (b) of FIG. 5, in the semiconductor module 10B, a recess 23b is formed on each of light emitting surfaces of a plurality of light emitting elements 151b, but a single recess 23b is formed on the light emitting surface of each light emitting element 151b. When the light emitting element 151b is combined with a growth substrate 181b, the recess 23b is formed by a protrusion 22b. The recess 23b has a tapered shape toward the base substrate 11. The surface of the growth substrate 181b on the base substrate 11 side is formed in an uneven shape, but an interval of a plurality of protrusions 22b formed on the surface of the growth substrate 181b on the base substrate 11 side is larger than an interval of a plurality of protrusions 22a. The protrusions 22b are formed on the surface of the growth substrate 181b on the base substrate 11 side such that the single recess 23b is formed on the light emitting surface of each light emitting element 151b. The protrusion 22b has a substantially conical shape.

As illustrated in (c) of FIG. 5, in the semiconductor module 10C, a recess 23c is formed on each of light emitting surfaces of a plurality of light emitting elements 151c. When the light emitting element 151c is combined with a growth substrate 181c, the recess 23c is formed by a protrusion 22c. The recess 23c has a tapered shape toward the base substrate 11. In a top view, in an area of the light emitting surface of the light emitting element 151c, an area of a portion occupied by the recess 23c is a half or more of the area of the light emitting surface of the light emitting element 151c. The surface of the growth substrate 181c on the base substrate 11 side is formed in an uneven shape, but a size of the protrusion 22c formed on the surface of the growth substrate 181c on the base substrate 11 side is larger than a size of the protrusion 22a. The protrusion 22c is formed on the surface of the growth substrate 181c on the base substrate 11 side such that, in an area of the light emitting surface of the light emitting element 151c, an area of a portion occupied by the recess 23c is a half or more of the area of the light emitting surface of the light emitting element 151c in a top view. The protrusion 22c has a substantially conical shape.

As illustrated in (d) of FIG. 5, in the semiconductor module 10D, a recess 23d is formed on each of light emitting surfaces of a plurality of light emitting elements 151d. When the light emitting element 151d is combined with a growth substrate 181d, the recess 23d is formed by a protrusion 22d. The recess 23d has a tapered shape toward the base substrate 11, and has a shape in which an inclined angle of an inner wall of the recess 23d changes once on the halfway. A surface of the growth substrate 181d on the base substrate 11 side is formed in an uneven shape, and the protrusion 22d formed on the surface of the growth substrate 181d on the base substrate 11 side has a shape in which a front end is sharp, and has a shape in which an inclined angle of an outer wall of the protrusion 22d changes once on the halfway.

As illustrated in (e) of FIG. 5, in the semiconductor module 10E, a recess is not formed on light emitting surfaces of a plurality of light emitting elements 151e, and a protrusion 22e is formed to enter between a plurality of light emitting elements 151e on a growth substrate 181e. The semiconductor module 10E is different from the semiconductor modules 10A to 10D in that a recess is not formed in the light emitting element 151e. However, the protrusion 22e is formed on the growth substrate 181e, and thus an effect of being capable of reducing damage on the base substrate 11 during separating-off of the growth substrate 181e is achieved in the same manner as in the semiconductor modules 10A to 10D.

As mentioned above, the protrusions 22a to 22e each has a substantially conical shape. It is preferable that a diameter of a bottom of the conical shape is 3 μm or less, a height thereof is 2 μm or less, and an angle of a vertex thereof is in a range from 60° to 120°.

Embodiment 4

Figure 6:
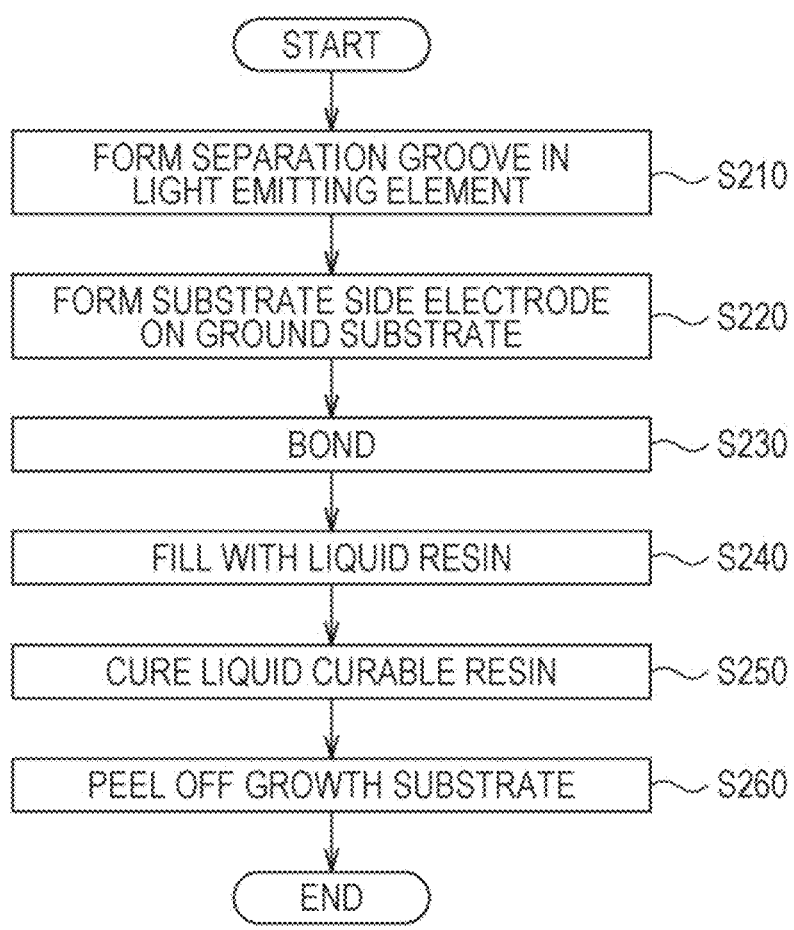
FIG. 6 is a flowchart for describing a method of manufacturing a semiconductor module according to Embodiment 4 of the present invention.

FIG. 6 is a flowchart for describing a method of manufacturing semiconductor modules 100A to 100C according to Embodiment 4 of the present invention. FIG. 7 corresponds to sectional views illustrating sectional configurations of the semiconductor modules 100A to 100C according to Embodiment 4 of the present invention. (a) of FIG. 7 is a diagram illustrating a configuration in which the outermost shape of the growth substrate 18 is the same as the outermost shape of the resin 16 in a top view, and (b) of FIG. 7 is a diagram illustrating a configuration in which the outermost shape of a growth substrate 182 is smaller than the outermost shape of the resin 16 in a top view. (c) of FIG. 7 is a diagram illustrating a configuration in which a resin 161 is partially formed on the base substrate 11 side. For convenience of description, a member having the same function as that of the member described in the embodiments will be given the same reference numeral, and description thereof will not be repeated.

As illustrated in (a) of FIG. 7, the semiconductor module 100A is different from the semiconductor module 1 in that the resin 16 is provided. The resin 16 fills between the base substrate 11 and each of a plurality of light emitting elements 15, and the groove 20 through which laser light directed toward the base substrate 11 passes during laser irradiation between the light emitting elements 15 adjacent to each other. The resin 16 completely covers the upper surface of the base substrate 11, the electrodes 14, and the side surfaces of the light emitting elements 15. The light emitting surface of the light emitting element 15 and a surface of the resin 16 on the growth substrate 18 side are located at the same height from the upper surface of the base substrate 11.

As illustrated in (b) of FIG. 7, in the semiconductor module 100B, filling with the resin 16 is performed such that the outermost shape of the resin 16 is larger than the outermost shape of the growth substrate 182 in a top view. For example, a case is assumed in which an electrode used to supply drive power to the drive circuit 11a of the base substrate 11 is formed on the upper surface of the base substrate 11 located outside the growth substrate 18 in a top view. In this case, in a top view, the electrode used to supply drive power is not covered with the growth substrate 18, but is covered with the resin 16. Consequently, in the step of separating off the growth substrate 18, the resin 16 can protect the electrode used to supply drive power from laser light applied to separate off the growth substrate 18.

As illustrated in (c) of FIG. 7, in the semiconductor module 100C, filling with the resin 161 is not performed to completely cover the upper surface of the base substrate 11, the electrodes 14, and the side surfaces of the light emitting elements 15, and the resin 161 is partially formed on the base substrate 11 side of the grooves 20. Here, the resin 161 is formed to partially cover the electrodes 14. A height of the surface of the resin 16 on the growth substrate 18 side from the upper surface of the base substrate 11 may be a height between the upper surface of the base substrate 11 and the light emitting surface of the light emitting element 15. A thickness of the resin 16 is preferably in a range from 0.2 μm to 30 μm. The thickness is a thickness along a direction directed from the base substrate 11 toward the growth substrate 18 (or the growth substrate 182). In a case where the thickness of the resin 16 is too small, laser light cannot be reflected or absorbed, and damage on the base substrate 11 may occur, and thus the thickness of the resin 16 is preferably equal to or more than 0.2 μm. From the viewpoint of balance with sizes of the metal wiring and the light emitting element 15, in a case where the thickness of the resin 16 is too large, a height of the resin 16 is larger than a height of the light emitting surface of the light emitting element 15. Thus, the thickness of the resin 16 is preferably equal to or less than 30 μm. The height is a height from the base substrate 11, and is a height along a direction directed from the base substrate 11 toward the growth substrate.

Since the resin 16 is formed on the base substrate 11 side of the groove 20, the resin 16 can protect the base substrate 11. Since a material having a function of reflecting or absorbing laser light is selected as a material of the resin 16, the resin 16 can reflect or absorb laser light in the step of separating off the growth substrate 18. Consequently, it is possible to reduce damage on the base substrate 11. In the semiconductor modules 100A and 100B, the light emitting surface of the light emitting element 15 and the surface of the resin 16 on the growth substrate 18 side are located at the same height from the upper surface of the base substrate 11. Consequently, the surfaces of the semiconductor modules 100A and 100B can be further smoothed by the resin 16. Since the surfaces of the semiconductor modules 100A and 100B are further smoothed, this is advantageous in a case where a color conversion layer or the like is formed on the light emitting surface of the light emitting element as in Embodiments 7 and 8 which will be described later.

(Resin 16)

Next, the resin 16 will be described, but the following description thereof is also applied to the resin 161. The resin 16 fixes the light emitting element 15 and the electrode 14 to the base substrate 11, and also prevents light from leaking out of the side surface of the light emitting element 15. The resin 16 is also referred to as an underfill, and may be formed by curing a liquid resin. The resin 16 is buried in a region including at least the upper surface of the base substrate 11, a part of the side surface of the light emitting element 15, and the side surface of the electrode 14 in the semiconductor module 100A.

The resin 16 protects the base substrate 11, and can also reduce damage on the base substrate 11 in the step of separating off the growth substrate 18 by reflecting or absorbing laser light. The light emitting element 15 emits light from the light emitting surface of the light emitting element 15 on the opposite side to the base substrate 11 side. Therefore, at least the side surface of the light emitting element 15 is coated with the resin 16, and thus the following advantageous effects can be achieved. First, it is possible to prevent light from leaking out of the side surface of the light emitting element 15. Second, it is possible to suppress light having a nonnegligible hue difference compared with light emission from the light emitting surface of the light emitting element 15 from being emitted outward from the side surface, and thus to reduce the occurrence of color unevenness in the entire light emission color. Third, light traveling in a side surface direction is reflected in a light extraction direction side of the semiconductor module 100A (or the semiconductor module 100B or 100C), and thus a light emission region is further restricted to the outside. Consequently, it is possible to increase the directivity of emitted light and also to increase light emission luminance in the light emitting surface 151. Fourth, heat generated from the light emitting element 15 is conducted to the resin 16, and thus it is possible to increase heat dissipation property of the light emitting element 15. Fifth, it is possible to increase moisture resistance of the light emission layer of the light emitting element 15.

As long as the side surface connected to the light emitting surface of the light emitting element 15, that is, the side surface side parallel to the thickness direction of the light emitting element 15 is coated with the resin 16, and the light emitting surface of the light emitting element 15 is exposed from the resin 16, an outer surface shape is not particularly limited. For example, a structure in which the resin 16 exceeds the light emitting surface of the light emitting element 15 and protrudes in the direction directed from the base substrate 11 toward the growth substrate 18 (or the growth substrate 182) may be employed. As illustrated in (c) of FIG. 7, a structure in which the resin 16 does not reach the light emitting surface of the light emitting element 15 in the direction directed from the base substrate 11 toward the growth substrate 18 may be employed.

In the semiconductor modules 100A and 100B, as illustrated in (a) and (b) of FIG. 7, the surface of the resin 16 on the growth substrate 18 side is formed to be along the surface shape of the light emitting surface of the light emitting element 15. In other words, the exposed surface of the coating region of the resin 16 is formed to be the substantially same surface as the light emitting surface of the light emitting element 15. Consequently, a variation in light emission characteristics in the semiconductor modules 100A and 100B is suppressed, and thus it is possible to improve a yield. The substantially entire side surface is coated, and thus it is possible to increase heat dissipation property of the light emitting element 15. The description in this paragraph is not applied to the resin 161.

In the present embodiment, the resin 16 is preferably made of a resin material having a characteristic of reflecting or absorbing laser light. A color of the resin 16 is preferably a white-based color or a black-based color.

(Fixation Enhancement of Electrode 14)

In (f) of FIG. 2, since the sectional area of the substrate side electrode 141 is different from the sectional area of the light emitting element side electrode 142, the resin 16 is also in contact with a region (step difference surface) in which a surface of any electrode is exposed in addition to the side surface of the substrate side electrode 141 and the side surface of the light emitting element side electrode 142. The adsorption action of the resin 16 is applied to the step difference surface, and thus the substrate side electrode 141 and the light emitting element side electrode 142 are more strongly fixed to the base substrate 11.

As illustrated in (f) of FIG. 2, in a case where the sectional area of the substrate side electrode 141 is larger than the sectional area of the light emitting element side electrode 142, fixation force pressing the substrate side electrode 141 toward the base substrate 11 from the upper part of the step difference surface in the substrate side electrode 141 acts on the substrate side electrode 141. Consequently, this is more preferable since the electrode 14 and the light emitting element 15 disposed thereon can be more stably fixed to the base substrate 11. The light emitting surface of the light emitting element 15 is preferably the substantially same surface as the surface of the resin 16 on the growth substrate 18 side. Consequently, light from the light emitting element 15 can be suppressed from being emitted from the side surface of the light emitting element 15, and thus it is possible to increase light emission efficiency of the light emitting element 15. The description of the resin 16 in this paragraph is not applied to the resin 161.

(Method of Manufacturing Semiconductor Modules 100A to 100C)

A method of manufacturing the semiconductor modules 100A to 100C will be described with reference to FIGS. 2 and 6. Processes in step S210 to step S230 and a process in step S260 illustrated in FIG. 6 are the same as the processes in step S110 to step S140 illustrated in FIG. 3. Herein, a description will be made of processes in step S240 and step S250 performed between the process in step S230 and the process in step S260.

(Step of Filling with Resin 16)

After the bonding step in step S230 is completed, a gap generated between the base substrate 11 and the growth substrate 18 is filled with a liquid resin 16a (step S240). The liquid resin 16a fills the groove 20 between the light emitting elements 15. A state after filling is illustrated in (f) of FIG. 2. In this case, for example, the base substrate and the growth substrate in a bonding state may be immersed in a container filled with the liquid resin 16a. A main material of the liquid resin 16a is not particularly limited, but is preferably, for example, epoxy resin. As a method of injecting the liquid resin 16a, in addition to the above-described method, there may be a method of injecting the liquid resin 16a by using an injection needle or a micro-needle matching a size of the gap generated between the base substrate 11 and the growth substrate 18. A material of the injection needle in this case may be metal or plastic. The liquid resin 16a fills the gap generated between the base substrate 11 and the growth substrate 18 due to a capillary phenomenon. The gap may be completely filled with the resin 16 as in the semiconductor modules 100A and 100B by controlling a filling amount of the liquid resin 16a. Only the base substrate 11 side may be filled with the resin 16 at a predetermined thickness as in the semiconductor module 100C by controlling a filling amount of the liquid resin 16a.

In the filling step, it is preferable to perform filling with the liquid resin 16a at a temperature within a temperature range from 50° C. to 200° C. Consequently, it becomes easier to normally fill the gap with the liquid resin 16a. The temperature range is more preferably a range from 80° C. to 170° C. Consequently, it is possible to reduce concern of impairing the characteristics (the contact property and the heat dissipation property after a curing process which will be described later) of the resin 16. The temperature range is more preferably a range from 100° C. to 150° C. Consequently, bubbles or the like generated in the gap can be reduced such that substantially complete filling can be performed without the occurrence of convection or the like, and thus the semiconductor modules 100A to 100C are easily manufactured.

Particularly, a case is assumed in which a size of each light emitting element 15 is set to a micro-size such that, for example, each of a vertical width and a horizontal width is equal to or less than 20 μm, more preferably, several μm to several tens of μm, and a thickness of the light emitting element 15 is several μm (2 μm to 10 μm). In this case, in the step of separating off the growth substrate 18 and the subsequent steps after separating, the liquid resin 16a more usefully functions as a reinforcement member for improving fixation force. Consequently, variations in characteristics of products of the semiconductor modules 100A to 100C can be further reduced by using the resin 16, and thus the semiconductor modules 100A to 100C can be easily manufactured.

The liquid resin 16a filling the gap is completely buried in the gap as illustrated in (f) of FIG. 2. Consequently, the side surface of the light emitting element 15, the side surface and the step difference surface of the electrode 14, and the upper surface of the base substrate 11 is buried with the liquid resin 16a. After filling with the liquid resin 16a is completed, the liquid resin 16a is cured (step S250). A method of curing the liquid resin 16a is not particularly limited, but, for example, the liquid resin 16a may be cured by heating the liquid resin 16a or irradiating the liquid resin 16a with ultraviolet rays.

The manufacturing method is only an example of a method causing the semiconductor modules 100A to 100C to be manufactured. Each step described herein is for enabling the semiconductor modules 100A to 100C to be easily manufactured, and steps forming a method of manufacturing the semiconductor modules 100A to 100C are not limited thereto.

Embodiment 5

FIG. 8 is a sectional view illustrating a sectional configuration of a semiconductor module 101A according to Embodiment 5 of the present invention. For convenience of description, a member having the same function as that of the member described in the embodiments will be given the same reference numeral, and description thereof will not be repeated.

As illustrated in FIG. 8, the semiconductor module 101A is different from the semiconductor module 1 in that the light shielding member 31 is provided. The light shielding member 31 is disposed to shield the groove 20 in a top view on the base substrate 11 side of the groove 20 through which laser light directed toward the base substrate 11 passes during laser irradiation between the light emitting elements 15 adjacent to each other. As one method for implementing a configuration of the semiconductor module 101A, the insulating layer 13 is formed on the base substrate 11, then the light shielding member 31 is formed on the upper surface of the base substrate 11, and then only a portion forming the electrode 14 in the light shielding member 31 is removed through etching or the like. The light shielding member 31 is formed according to chemical vapor deposition (CVD), MBE, or sticking. The light shielding member 31 is formed, and then the flow proceeds to the process in step S120. Processes after the process in step S120 are the same as in Embodiment 1. The light shielding member 31 may be made of a resin such as polyimide, epoxy, or silicone, and the material may contain a color material or a filler. The light shielding member 31 may be made of an inorganic material such as GaN, $SiO_2$, SiN, or SiC. A thickness of the light shielding member 31 is preferably in a range from 0.2 µm to 10 µm. The thickness is a thickness along a direction directed from the base substrate 11 toward the growth substrate 18.

In the semiconductor module 101A, in the step of separating off the growth substrate 18, the light shielding member 31 can reduce damage on the base substrate 11 by reflecting or absorbing laser light, and thus it is possible to improve product quality of the semiconductor module 101A. The light shielding member 31 may be a light reflective member reflecting laser light.

Embodiment 6

FIG. 9 corresponds to sectional views illustrating sectional configurations of semiconductor modules 102A and 102B according to Embodiment 6 of the present invention. (a) of FIG. 9 is a diagram illustrating a configuration in which a resin 161a is formed in an uneven shape, and (b) of FIG. 9 is a diagram illustrating a configuration in which a light emitting element 152 and a resin 161b are formed in an uneven shape.

FIG. 10 is a flowchart for describing a method of manufacturing the semiconductor modules 102A and 102B according to Embodiment 6 of the present invention. For convenience of description, a member having the same function as that of the member described in the embodiments will be given the same reference numeral, and description thereof will not be repeated.

As illustrated in (a) of FIG. 9, the semiconductor module 102A is different from the semiconductor module 100A in that a surface of a growth substrate 183a on the base substrate 11 side is formed in an uneven shape, and a surface of the resin 161a on the growth substrate 183a side is formed in an uneven shape. Specifically, a plurality of protrusions 221 are formed on a surface of the growth substrate 183a on the base substrate 11 side, and a plurality of recesses 32 are formed on a surface of the resin 161a on the growth substrate 183a side. When the resin 161a is combined with the growth substrate 183a, the recess 32 is formed by the protrusion 221. The recess 32 is formed on the surface of the resin 161a on the growth substrate 183a side in a portion filling the groove 20 between the light emitting elements 15. In a step of separating off the growth substrate 183a, the growth substrate 183a is separated off such that the surface of the resin 161a on the growth substrate 183a side is formed in an uneven shape.

Consequently, in the step of separating off the growth substrate 183a, since the resin 161a reflects or absorbs laser light, and the laser light is also scattered by the uneven shape formed on the growth substrate 183a, an amount of laser light passing between the light emitting elements 15 is reduced. Consequently, it is possible to reduce damage on the base substrate 11.

As illustrated in (b) of FIG. 9, in the semiconductor module 102B, a surface of the resin 161b on a growth substrate 183b side is formed in an uneven shape, and a light emitting surface of the light emitting element 152 is also formed in an uneven shape. Specifically, a plurality of protrusions 22a are formed on a surface of the growth substrate 183b on the base substrate 11 side, and a plurality of recesses 231 are formed on the light emitting surface of the light emitting element 152. The recess 32 is formed on the surface of the resin 161b on the growth substrate 183b side. When the light emitting element 152 and the resin 161b are combined with the growth substrate 183b, the recesses 32 and 231 are formed by the protrusions 22a.

Consequently, it is possible to reduce damage on the base substrate 11 by using the uneven shape formed on the growth substrate 183b, and also to improve the efficiency of extracting light from the light emitting element 152 by using the uneven shape of the light emitting surface of the light emitting element 152. Therefore, it is possible to improve product quality of the semiconductor module 102B.

As one method for implementing the configurations of the semiconductor modules 102A and 102B, a growth substrate such as a PSS having an uneven shape may be used as the growth substrate 183a (or the growth substrate 183b). A manufacturing method is the same as the method of manufacturing the semiconductor module 100A except the use of the growth substrate having an uneven shape.

(Method of Manufacturing Semiconductor Modules 102A and 102B)

A method of manufacturing the semiconductor modules 102A and 102B will be described with reference to FIGS. 2 and 10. Processes in step S310 to step S330 and a process in step S360 illustrated in FIG. 10 are the same as the processes in step S110 to step S140 illustrated in FIG. 3. Processes in step S340 and step S350 illustrated in FIG. 10 are the same as the processes in step S240 and step S250 illustrated in FIG. 6. Herein, a description will be made of processes in step S370 and step S380 performed after the process in step S360.

(Step of Polishing Separated Surface of Light Emitting Element 15)

After the separating step in step S360 is completed, an exposed surface (a separated surface of the light emitting element 15) of the n-type nitride-based compound semiconductor laminate structure is polished (step S370). The method of manufacturing the semiconductor modules 102A and 102B is characterized in including a polishing step of polishing an exposed surface of the light emitting element 15 that is exposed when the growth substrate 183a is separated off. In the polishing step, the exposed surface of the light emitting element 15 may be polished according to chemical mechanical polish (CMP) or the like. Even in a case where a PSS is used as the growth substrate 183a, polishing may be performed until an uneven shape of the light emitting surface of the light emitting element 15 is removed. In a case where polishing is performed until the uneven shape of the light emitting surface of the light emitting element 15 is removed, a configuration of the semiconductor module of the present embodiment is the same as the configurations of the semiconductor modules 100A and 100B illustrated in (a) and (b) of FIG. 7. As a polishing agent used for the CMP, $SiO_2$, $Al_2O_3$, diamond, $Mn_2O_3$, and $CeO_2$ may be used, and, particularly, $SiO_2$ is preferably used.

(Step of Cleaning Separated Surface of Light Emitting Element 15)

After the step of polishing the separated surface of the light emitting element 15 is completed, the polished exposed surface (the separated surface of the light emitting element 15) of the n-type nitride-based compound semiconductor laminate structure is cleaned (step S380). After the separating step in step S360 is completed, the cleaning step (step S380) may be performed, and then the polishing step (step S370) may be performed.

In a case where the polishing step is performed after the cleaning step is performed, the polishing step is performed, and then the cleaning step is performed again. After the separating step in step S360 is completed, only the polishing step may be performed without performing the cleaning step, and only the cleaning step may be performed without performing the polishing step.

After the polishing step in step S370 is completed, residues generated during the polishing remain on the exposed surface (the separated surface of the light emitting element 15) of the n-type nitride-based compound semiconductor laminate structure. A droplet such as Ga is generated on the exposed surface (the separated surface of the light emitting element 15) of the n-type nitride-based compound semiconductor laminate structure that is exposed when the growth substrate 183a is separated off through laser irradiation. There is a high probability that the droplet may remain even after the polishing step in step S370 is completed. Thus, one or more cleaning agents are selected as water (hot water) at a temperature equal to or higher than the melting point of Ga and diluted hydrochloric acids, and the exposed surface is cleaned with the cleaning agents.

In other words, the method of manufacturing the semiconductor modules 102A and 102B is characterized in including the cleaning step of cleaning the exposed surface of the light emitting element 15 that is exposed when the growth substrate 183a is separated off. In the cleaning step, the exposed surface is cleaned with hot water or is immersed in the hot water, and thus residues on the exposed surface can be removed. Preferably, the exposed surface is immersed in diluted hydrochloric acids at the room temperature or boiled diluted hydrochloric acids, or is cleaned with diluted hydrochloric acids at the room temperature or boiled diluted hydrochloric acids. More preferably, the exposed surface is cleaned with hot water and is immersed in the hot water, and is then immersed in diluted hydrochloric acids.

In a case where the exposed surface of the light emitting element 15 is not cleaned, when the n-type nitride-based compound semiconductor layer becomes a light emitting surface, light is absorbed, reflected, and scattered by a residue and/or a droplet such as Ga remaining on the exposed surface, and thus light emitted from the light emission layer of the light emitting element 15 is blocked. Therefore, the light extraction efficiency of the light emitting element 15 is reduced. When the cleaned n-type nitride-based compound semiconductor layer becomes a light emitting surface, the exposed surface of the light emitting element 15 is cleaned, and thus light emitted from the light emission layer of the light emitting element 15 is not blocked. Therefore, it is possible to considerably improve the light extraction efficiency of the light emitting element 15. The temperature of the hot water used to clean the exposed surface of the light emitting element 15 is preferably a temperature equal to or higher than the melting point of Ga, and a temperature of diluted hydrochloric acids is preferably a temperature of the room temperature or higher and 110° C. or lower.

The polishing step and/or the cleaning step are (is) performed, and thus a residue can be made not to remain on the light emitting surface of the light emitting element 15 and the surface of the resin 161a on the growth substrate 183a side. Particularly, the polishing step is performed, and thus the light emitting surface of the light emitting element 15 and the surface of the resin 161a on the growth substrate 183a side can be made a substantially flat surface shape. Thus, in a case where a color conversion layer is formed on the light emitting element 15, the color conversion layer can be applied or patterned on a flat surface on which a residue does not remain. Consequently, a color conversion layer with a more uniform thickness can be formed on a plurality of light emitting elements 15.

The color conversion layer is made of a color conversion material such as a phosphor or a light absorption material, and a resin serving as a base material, and is used to convert a spectrum of light emitted from the light emitting element 15 into, for example, green or red.

As mentioned above, a residue can be made not to remain on the light emitting surface of the light emitting element 15 and the surface of the resin 161a on the growth substrate 183a side by performing the cleaning step and/or the polishing step after the growth substrate 183a is separated off. Therefore, it is possible to improve the light extraction efficiency of the light emitting element 15. In a case where a color conversion layer is formed on the light emitting element 15, the color conversion layer can be applied or patterned on a flat surface on which a residue does not remain. Therefore, in a case where a semiconductor module having the color conversion layer is manufactured, it is possible to improve product quality of the semiconductor module.

The manufacturing method is only an example of a method causing the semiconductor modules 102A and 102B to be manufactured. Each step described herein is for enabling the semiconductor modules 102A and 102B to be easily manufactured, and steps forming a method of manufacturing the semiconductor modules 102A and 102B are not limited thereto.

Embodiment 7

FIG. 11 is a sectional view illustrating a sectional configuration of a semiconductor module 103 according to Embodiment 7 of the present invention. For convenience of description, a member having the same function as that of the member described in the embodiments will be given the same reference numeral, and description thereof will not be repeated.

As illustrated in FIG. 11, the semiconductor module 103 is different from the semiconductor module 102B in that a light transmissive resin 41 and color conversion layers 42 and 43 are provided. As the color conversion layers 42 and 43, there may be a plurality of color conversion layers. For example, in the semiconductor module 103, the color conversion layer 42 is a green conversion layer, and the color conversion layer 43 is red conversion layer. For example, the light emitting element 152 of the semiconductor module 103 is a blue LED emitting blue light. In a method of manufacturing the semiconductor module 103, after the cleaning step in step S370 and/or the polishing step in step S380, the light transmissive resin 41 and the color conversion layers 42 and 43 are respectively disposed on upper parts (light emitting surfaces) of the light emitting elements 152.

The light transmissive resin 41 is disposed on the upper part of the light emitting element 152, and the color conversion layer 42 is disposed on the upper part (light emitting surface) of the light emitting element 152 adjacent to the light emitting element 152 on which the light transmissive resin 41 is disposed. The color conversion layer 43 is disposed on the upper part (light emitting surface) of the light emitting element 152 adjacent to the opposite side to the light emitting element 152 side on which the light transmissive resin 41 is disposed with respect to the light emitting element 152 on which the color conversion layer 42 is disposed. Each of the light transmissive resin 41 and the color conversion layers 42 and 43 is formed to cover at least the light emitting surface of the light emitting element 152 according to, for example, a photolithography method or a screen printing method.

The light transmissive resin 41 allows light emitted from the light emitting element 152 disposed directly thereunder to pass therethrough without converting a wavelength of the light. In other words, the light transmissive resin 41 emits blue light. The color conversion layer 42 converts a wavelength of light emitted from the light emitting element 152 disposed directly thereunder, and thus emits green light. The color conversion layer 43 converts a wavelength of light emitted from the light emitting element 152 directly thereunder, and thus emits red light. Consequently, the semiconductor module 103 can emit light with three primary colors such as red light, green light, and blue light. A display apparatus incorporating the semiconductor module 103 can perform color display by controlling each light emitting element 152.

Each of the color conversion layers 42 and 43 is formed of, for example, a color conversion layer including a glass plate and a color conversion member on the glass plate, or a single crystal body or a polycrystal body having a phosphor crystal of a color conversion member or a phase of the phosphor crystal, an amorphous body, or a ceramic body. Each of the color conversion layers 42 and 43 is formed of, for example, a sintered body of phosphor crystal particles and a light transmissive member that is appropriately added, or a member in which an aggregate and a porous material are mixed or impregnated with a light transmissive member (for example, a resin). Each of the color conversion layers 42 and 43 is formed of a light transmissive member containing phosphor crystal particles, for example, a molded article of a light transmissive resin.

The light transmissive member is preferably made of an inorganic material rather than an organic material such as a resin from the viewpoint of heat resistance. Specifically, the light transmissive member is preferably made of an inorganic light transmissive material containing phosphor crystal particles, and is more preferably made of a sintered body of phosphor crystal particles and an inorganic substance (binder), or a sintered body or a single crystal containing phosphor crystal particles. Consequently, the reliability of the light transmissive member is increased. In a case where a phosphor of $Y_3Al_5O_{12}$ activated with trivalent Ce, from the viewpoint of reliability, a single crystal of $Y_3Al_5O_{12}$, a high-purity sintered body, or a sintered body of $Y_3Al_5O_{12}$/alumina having alumina ($Al_2O_3$) are used as a binder is preferable. A shape of each of the color conversion layers 42 and 43 is not particularly limited, but, in the semiconductor module 103, the shape of each of the color conversion layers 42 and 43 is a rectangular parallelepiped shape. A thickness of each of the color conversion layers 42 and 43 is substantially uniform such that biasing of the phosphors (wavelength conversion members) in the color conversion layers 42 and 43 can be suppressed, and thus a wavelength conversion quantity of light passing through the color conversion layers 42 and 43 can be made substantially uniform. Consequently, a ratio of color mixture can be stabilized, and thus it is possible to suppress color unevenness in light emission of the semiconductor module 103. The thickness of each of the color conversion layers 42 and 43 is a thickness along a direction directed from the base substrate 11 toward the light emitting element 152. In a method of manufacturing the semiconductor module 103, in a case where shapes of the color conversion layers 42 and 43 are rectangular parallelepiped shapes, the color conversion layers 42 and 43 can be easily formed. From the light extraction efficiency of the light emitting element 152, a surface of each of the color conversion layers 42 and 43 on the opposite side to the light emitting element 152 is formed in an uneven shape or a hemispherical shape, or an end of the surface is disposed with an angle, and thus the light extraction efficiency can be improved. Surfaces including the light emitting surface of the light emitting element 152 and the upper surface of the resin 16 can be made substantially uniform through polishing, cleaning, and the like. Consequently, a principal surface of the color conversion layer 42 and a principal surface of the color conversion layer 43 can be easily aligned to be substantially patient each other.

White light can be emitted through appropriate combinations of the light emitting elements 152, and representative phosphors used for the wavelength conversion member may include phosphors of $Y_3Al_5O_{12}$ activated with trivalent Ce and $Lu_3Al_5O_{12}$ activated with trivalent Ce. A general formula of such phosphors is represented by $(Re_{1-x}Ce_x)_3(Al_{1-y}Ga_y)_5O_{12}$ (where $0 \le x < 0.2$, $0 \le y \le 1$, and Re is at least one element selected from the group consisting of Y, Gd, La, and Lu). In addition, $(La_{1-x-y}Y_xGd_y)_3Si_6N_{11}$ activated with trivalent Ce, alpha-type SiAlON activated with trivalent Ce, $(Ca_{1-x-y}Sr_xBa_y)_5(PO_4)_3(Cl_{1-z}F_z)$ activated with divalent Eu, $(Lu_{1-x-y}Y_xLa_y)Si_3N_5$ activated with trivalent Ce, $BaMgAl_{10}O_{17}$ activated with divalent Eu, $BaMgAl_{10}O_{17}$ activated with divalent Eu and divalent Mn, $(Sr_{1-x}Ba_x)_2SiO_4$ activated with divalent Eu, $(Sr,Ba)_3SiO_5$ activated with divalent Eu, beta-type SiAlON activated with divalent Eu, $(Ca_{1-x-y}Sr_xBa_y)_3(Sc_{1-z}Y_z)_2Si_3O_{12}$ activated with trivalent Ce, $(Ca_{1-x-y}Sr_xBa_y)Si_5N_8$ activated with divalent Eu, $K_2(Si_{1-x}Ge_x)F_6$ activated with tetravalent Mn, $(Ca_{1-x}Sr_x)AlSiN_3$ activated with divalent Eu may be used. Here, for x and y, $0 \le x < 0.2$, and $0 \le y \le 1$. Among the phosphors, at least one phosphor may be used for a wavelength conversion member.

In the semiconductor module 103, since a residue does not remain on at least the light emitting surface of the light emitting element 152, it is possible to increase contact force of the light transmissive resin 41, the color conversion layer 42, and the color conversion layer 43 with the light emitting surfaces of the light emitting elements 152. The thicknesses of the light transmissive resin 41, the color conversion layer 42, and the color conversion layer 43 are also uniform, and thus optical characteristics are improved. Surfaces including the light emitting surface of the light emitting element 152 and the upper surface of the resin 162 are made substantially uniform through the polishing step and the cleaning step as described in Embodiment 6. Consequently, it becomes easier to determine the thicknesses of the light transmissive resin 41, the color conversion layer 42, and the color conversion layer 43, and thus it is possible to improve optical characteristics. Patterns can be stably formed in various steps of forming phosphors (for example, a photolithography method or a screen printing method), and thus it is possible to improve product quality.

Embodiment 8

FIG. 12 is a sectional view illustrating a sectional configuration of a semiconductor module 104 according to Embodiment 8 of the present invention. For convenience of description, a member having the same function as that of the member described in the embodiments will be given the same reference numeral, and description thereof will not be repeated.

As illustrated in FIG. 12, the semiconductor module 104 is different from the semiconductor module 103 in that a light absorption layer 51 is disposed on the upper part of the color conversion layer 42, and a light absorption layer 52 is disposed on the upper part of the color conversion layer 43. Each of the light absorption layers 51 and 52 contains at least one kind of light absorption material such as dye molecules, and a light absorption material contained in the light absorption layer 51 and a light absorption material contained the light absorption layer 52 may or not be the same as each other. A light absorption layer (not illustrated) may be disposed on the upper part of the light transmissive resin 41.

A method of forming the light absorption layers 51 and 52 will be described below. For example, a material forming each of the light absorption layers 51 and 52 is a resin containing a dye as a light absorption material, and is photosensitive. For example, a light absorption material is uniformly applied onto a color conversion layer according to a spin coating method, and then the light absorption layers 51 and 52 are formed such that the light absorption material covers at least an upper surface (light emitting surface) of the color conversion layer according to a photolithography method. Even in a case where materials forming the light absorption layers 51 and 52 are not photosensitive, the light absorption layers 51 and 52 may be formed such that the light absorption material covers at least one the upper surface of the color conversion layer according to a method such as screen printing or etching.

For example, the light absorption layer 52 absorbs light with a specific wavelength among emission spectra from the light emitting element 152 and the color conversion layer 43, and can improve a color reproduction range of the semiconductor module 104. The light absorption layer 52 absorbs a light component with a wavelength shorter than 630 nm and a light component with a length longer than 650 nm among light components emitted from a red phosphor of the color conversion layer 43. The light absorption layer 52 absorbs blue light that is emitted from the light emitting element 152 and passes through the color conversion layer 43 without being absorbed by the red phosphor contained in the color conversion layer 43. Consequently, light emitted from the light absorption layer 52 has a spectral component of 630 nm or more and 650 nm or less as a main component, and thus higher-purity red can be obtained. The light absorption layer 51 has a function similar to that of the light absorption layer 52, and thus enables high-purity green to be obtained. As mentioned above, since the light absorption layers 51 and 52 are respectively disposed on the upper parts of the color conversion layers 42 and 43, it is possible to improve a color reproduction range of the semiconductor module 104 and thus to improve product quality of the semiconductor module 104.

Embodiment 9

FIG. 13 is a sectional view illustrating a sectional configuration of a semiconductor module 105 according to Embodiment 9 of the present invention. For convenience of description, a member having the same function as that of the member described in the embodiments will be given the same reference numeral, and description thereof will not be repeated.

As illustrated in FIG. 13, the semiconductor module 105 is different from the semiconductor module 1 in that, as light emitting elements, a plurality of blue light emitting elements 153a, a plurality of green light emitting elements 153b, and a plurality of red light emitting elements 153c are mounted thereon. The semiconductor module 105 may be formed of any combination of the blue light emitting elements 153a and the green light emitting elements 153b or the blue light emitting elements 153a and the red light emitting elements 153c. The blue light emitting element 153a, the green light emitting element 153b, and the red light emitting element 153c are electrically coupled to the base substrate 11 via the metal wiring and the electrode 14, and can thus be operated by the drive circuit 11a of the base substrate 11. A distance between the blue light emitting elements 153a is 0.1 μm or more and 20 μm or less. A distance between the respective light emitting elements is preferably 0.1 μm or more and 20 μm or less. In a case where the distance between the light emitting elements 15 is equal to or less than 20 μm, an amount of laser light reaching the base substrate 11 side through laser irradiation, and thus it is possible to reduce damage on the base substrate 11, the metal wiring, the insulating layer, and the electrode 14 in a step of separating off the growth substrate. High definition image display is possible. On the other hand, in a case where the width of the groove 20 is small, an electrostatic capacitance between the adjacent electrodes 14 increases, and, thus, when a voltage is applied to the light emitting elements, electromotive force may be generated due to coupling noise between the adjacent electrodes 14. Consequently, accurate lighting control for the light emitting element is inhibited, or a reverse voltage is applied to the light emitting element, and thus deterioration in the light emitting element may occur. Therefore, the width of the groove 20 is preferably equal to or more than 0.1 µm. From the viewpoint of reliability of the semiconductor module 105, the light emitting element is preferably maintained at a light emission intensity of 50% or more after being lighted for 1000 hours with respect to an initial light emission intensity at the time of being manufactured. In order to prevent deterioration in the light emitting element due to a reverse voltage, the distance between the light emitting elements is preferably equal to or more than 0.1 µm.

Hereinafter, a description will be made of a method of forming the blue light emitting element 153a, the green light emitting element 153b, and the red light emitting element 153c. In the same manner as in the steps of forming the light emitting element in Embodiment 1, the blue light emitting element 153a is formed by epitaxially growing a semiconductor layer on a growth substrate, performing a mesa step, and forming an electrode. Each of the green light emitting element 153b and the red light emitting element 153c is mounted on the base substrate 11 after a metal wiring and an insulating layer are formed on the base substrate 11. Thereafter, after a step of aligning the growth substrate with the base substrate 11, the semiconductor module 105 may be manufactured through the same steps as in other embodiments. As another method of manufacturing the semiconductor module 105, a growth substrate on which the blue light emitting element 153a is formed is aligned with and bonded to the base substrate 11, and then the growth substrate of the blue light emitting element 153a is separated off. A growth substrate on which the green light emitting element 153b is formed is aligned with and bonded to the base substrate, and then the growth substrate of the green light emitting element 153b is separated off. A growth substrate on which the red light emitting element 153c is formed is aligned with and bonded to the base substrate, and then the growth substrate of the red light emitting element 153c is separated off and polished, or the growth substrate is eliminated through etching or the like. When each of growth substrates of the green light emitting element 153b and the red light emitting element 153c is separated off, a part or the whole of the growth substrate is separated off. In the latter step, for example, the growth substrate is a sapphire substrate, the blue light emitting element is made of a GaN-based semiconductor, the green light emitting element 153b is made of an InGaN-based semiconductor, and the red light emitting element 153c is made of a GaAs-based semiconductor. Heights of the respective color light emitting elements are substantially the same as each other, or the blue light emitting element 153a is made lowest, and the red light emitting element 153c is made highest. Consequently, during bonding of each light emitting element, mechanical interference between a growth substrate of the light emitting element of each color and a light emitting element mounted earlier can be prevented. However, an order of bonding of the light emitting elements of the respective colors may be changed, and, in this case, the need for a height of each light emitting element differs. Heights of upper surfaces of the blue light emitting element 153a, the green light emitting element 153b, and the red light emitting element 153c may be different from each other, and may be substantially uniform. Growth substrates and the base substrate 11 are bonded together by using the blue light emitting element 153a, the green light emitting element 153b, and the red light emitting element 153c with the different heights, and the growth substrates are separated off. Thereafter, the heights of the blue light emitting element 153a, the green light emitting element 153b, and the red light emitting element 153c may be made uniform through a polishing step. As in Embodiments 4, 6, 7, and 8, a resin having a light reflection or absorption characteristic is injected and formed between the respective light emitting elements, and thus it is possible to reduce an amount of light that is emitted from each light emitting element and reaches the adjacent light emitting elements. Consequently, a display apparatus can perform high definition image display.

The manufacturing method is only an example of a method causing the semiconductor module 105 to be manufactured. Each step described herein is for enabling the semiconductor module 105 to be easily manufactured, and steps forming a method of manufacturing the semiconductor module 105 are not limited thereto.

Embodiment 10

FIG. 14 is a diagram for describing a method of manufacturing a semiconductor module 106 according to Embodiment 10 of the present invention. FIG. 15 is a flowchart illustrating a method of manufacturing the semiconductor module 106 according to Embodiment 10 of the present invention. For convenience of description, a member having the same function as that of the member described in the embodiments will be given the same reference numeral, and description thereof will not be repeated.

(Method of Manufacturing Semiconductor Module 106)

A method of manufacturing the semiconductor module 106 will be described with reference to FIGS. 14 and 15. Processes in step S410 to step S440 illustrated in FIG. 15 are respectively the same as the processes in step S110 to step S140 illustrated in FIG. 3. Processes in step S460, step S480, and step S490 illustrated in FIG. 15 are the same as the processes in step S350, step S370, and step S380 illustrated in FIG. 10.

Herein, a description will be made of a process in step S450 performed after the process in step S440, a process in step S470 performed after the process in step S460, and processes in step S500 and step S510 performed after the process in step S490.

As illustrated in (a) of FIG. 14, the light emitting elements 15 are provided on the base substrate 11 via the electrodes 14, and metal terminals 61 and insulating layers 62 are also provided thereon. The metal terminal 61 is used to supply power for driving the drive circuit 11a formed on the base substrate 11 from an external device. The metal terminal 61 is electrically coupled to the drive circuit 11a formed on the base substrate 11, and is electrically coupled to the electrode 14.

After the separating step in step S440 is completed, as illustrated in (b) of FIG. 14, in a step of filling with a resin 164, filling with the resin 164 is performed such that the upper surface of the base substrate 11 and the entire exposed surface of the light emitting element 15 are covered (step S450). In the step of filling with the resin 164, the entire exposed surfaces of the electrode 14, the metal terminal 61, and the insulating layer 62 are covered with the resin 164.

After the filling step in step S450 is completed, as illustrated in (c) of FIG. 14, a portion of the resin 164 located over a height (horizontal plane) from the base substrate 11, including the upper surface of the light emitting element 15 is removed. In other words, a part of the resin 164 (a portion corresponding to a thickness reaching the upper surface of the resin 164 from the upper surface of the light emitting element 15) is removed (step S470). Consequently, since the upper surface of the light emitting element 15 is exposed, a device (not illustrated) removing a resin 164a can be aligned with the metal terminal 61 with the light emitting element 15 as a reference in the process in step S510 which will be described later.

After the step of removing the part of the resin 164 in step S470 is completed, the upper surface of the light emitting element 15 is polished (step S480). The upper surface of the light emitting element 15 is polished, and thus a height of the upper surface of the light emitting element 15 from the base substrate 11 is reduced (the light emitting element 15 is thinned through polishing). After the step of polishing the upper surface of the light emitting element 15 in step S480 is completed, the upper surface of the light emitting element 15 is cleaned (step S490). After the step of cleaning the upper surface of the light emitting element 15 in step S490 is completed, the resin 164 becomes the resin 164a.

After the step of cleaning the upper surface of the light emitting element 15 in step S490 is completed, as illustrated in (d) of FIG. 14, the color conversion layers 42 and 43 are respectively disposed on different light emitting elements 15 (step S500). Specifically, the color conversion layer 42 is disposed on the upper part of the light emitting element 15, and the color conversion layer 43 is disposed on the upper part of the light emitting element 15 adjacent to the light emitting element 15 on which the color conversion layer 42 is disposed.

After the step of disposing the color conversion layers 42 and 43 on the light emitting elements 15 in step S500 is completed, as illustrated in (e) of FIG. 14, a portion of the resin 164a present on the metal terminal 61 is removed (step S510). When the portion of the resin 164a present on the metal terminal 61 is removed, a recess 71 is formed on the metal terminal 61.

A gold (Au) bump is formed in the recess 71 to be used as an electrode for external coupling.

A portion of the resin 164a around the metal terminal 61 is removed. Specifically, a portion of the resin 164a located near and over an upper surface of the metal terminal 61 is removed, or a portion of the resin 164a located over an upper surface of the insulating layer 62 is removed. Wire bonding, soldering, formation of a gold (Au) bump, or coupling of a connector is performed on the exposed metal terminal 61.

As mentioned above, the metal terminal 61 can be easily coupled to an external device, and thus power can be easily supplied to the semiconductor module 106.

The semiconductor module 106 may be mounted on a polyimide film or the like having an electrical wiring, or other substrates. Consequently, the semiconductor module 106 is easily mounted on a display apparatus. For example, a coupling connector coupled to the semiconductor module 106 is provided on one side of a polyimide film or the like, and a coupling connector coupled to a display apparatus is provided on the other side of the polyimide film or the like. The polyimide film or the like mounted with the semiconductor module 106 is bendable, and thus the semiconductor module 106 can be easily mounted on the display apparatus.

[Method of Manufacturing Semiconductor Module]

In the above-described respective embodiments, steps S110, S210, S310, and S410 of forming a dividing groove between light emitting elements and steps S120, S220, S320, and S420 of forming a substrate side electrode on a base substrate may be reverse to each other in a step order.

[Summary]

The semiconductor module 1, 10, 10A to 10E, 100A to 100C, 101A, 102A, 102B, 103, 104, or 105 related to Aspect 1 of the present invention includes the base substrate 11 provided with the drive circuit 11a, and a plurality of light emitting elements 15, 151a to 151d, or 152 electrically coupled to the drive circuit, in which a distance between the light emitting elements adjacent to each other is equal to or less than 20 µm in a top view.

According to the configuration, a distance between the light emitting elements is 0.1 µm or more and 20 µm or less in a top view. Consequently, for example, when a growth substrate is separated off, the intensity of laser light reaching a base substrate is low during irradiation with the laser light. Thus, it is possible to reduce damage on the base substrate, occurring when the growth substrate is separated off. Therefore, it is possible to reduce damage on the base substrate provided with the drive circuit driving the light emitting element, for example, in a step of separating off a growth substrate.

The semiconductor module 10 related to Aspect 2 of the present invention includes the base substrate 11 provided with the drive circuit 11a, a plurality of light emitting elements 15 electrically coupled to the drive circuit, and a semiconductor layer that shields a space between the light emitting elements adjacent to each other on an opposite side to the base substrate in a top view.

According to the configuration, for example, when a growth substrate is separated off from a plurality of light emitting elements through irradiation with laser light, the semiconductor layer absorbs the laser light, and thus it is possible to reduce damage on the base substrate provided with the drive circuit. A surface of the semiconductor module on the growth substrate side can be further smoothed.

The semiconductor module 10A to 10D, 102B, 103, or 104 related to Aspect 3 of the present invention includes the base substrate 11 provided with the drive circuit 11a, and a plurality of light emitting elements 151a to 151d or 152 electrically coupled to the drive circuit, in which a surface of each of the plurality of light emitting elements on an opposite side to the base substrate is formed in an uneven shape.

According to the configuration, the surface of each light emitting element on the opposite side to the base substrate is formed in an uneven shape, and thus it is possible to improve light extraction efficiency of the light emitting element. Therefore, in the semiconductor modules, it is possible to improve the light extraction efficiency of the light emitting element and thus to improve product quality of the semiconductor modules.

The semiconductor module 100A to 100C, 102A, 102B, 103, or 104 related to Aspect 4 of the present invention includes the base substrate 11 provided with the drive circuit 11a, a plurality of light emitting elements 15 and 152 electrically coupled to the drive circuit, and the resin 16, 161, 161a, 161b, 162, or 163 filling a groove between the light emitting elements adjacent to each other.

According to the configuration, the groove between the light emitting elements is filled with the resin, and thus the resin can protect the base substrate. For example, a material having a function of reflecting or absorbing laser light is selected as the resin, and thus the resin can reflect or absorb laser light in a step of separating off a growth substrate. Consequently, it is possible to reduce damage on the base substrate.

The semiconductor module 101A related to Aspect 5 of the present invention includes the base substrate 11 provided with the drive circuit 11a, a plurality of light emitting elements 15 electrically coupled to the drive circuit, and the light shielding member 31 or a light reflective member that shields a groove between the light emitting elements adjacent to each other on the base substrate side of the groove in a top view.

According to the configuration, in a top view, the light shielding member or the light reflective member shields the groove. Consequently, in a step of separating off a growth substrate, the light shielding member reflects or absorbs laser light, and thus an amount of the laser light passing between the light emitting elements is reduced. Consequently, it is possible to reduce damage on the base substrate and thus to improve product quality of the semiconductor module.

According to the semiconductor modules 102A, 102B, 103, or 104 related to Aspect 6 of the present invention, in the above Aspect 4, a surface of the resin 161a, 161b, 162, or 163 on an opposite side to the base substrate 11 may have an uneven shape.

The semiconductor module 103 or 104 related to Aspect 7 of the present invention according to any one of the above Aspects 1 to 6 may further include a plurality of color conversion layers 42 or 43 respectively disposed on upper parts of the plurality of light emitting elements 152.

According to the configuration, a plurality of color conversion layers are respectively disposed on upper parts of the plurality of light emitting elements. Consequently, light emitted from the light emitting element passes through the color conversion layer, and, thus, for example, in a case where various types of color conversion layers are used, light with various colors can be emitted from a plurality of color conversion layers.

A display apparatus related to Aspect 8 of the present invention may include the semiconductor module 1, 10, 10A to 10E, 100A to 100C, 101A, 102A, 102B, 103, or 104 according to any one of the above Aspects 1 to 7.

A method of manufacturing a semiconductor module related to Aspect 9 of the present invention includes a step of forming a plurality of light emitting elements from a semiconductor layer grown on a growth substrate; and a step of separating off the growth substrate from the plurality of light emitting elements through laser irradiation, in which the step of forming the plurality of light emitting elements includes a step of forming a distance between the light emitting elements adjacent to each other to be 0.1 µm or more and 20 µm or less in a top view, a laser light directed toward a base substrate during the laser irradiation passing between the light emitting elements, and in which the plurality of light emitting elements are electrically coupled to a drive circuit formed on the base substrate.

According to the configuration, the same effect as in the above Aspect 1 is achieved.

According to the method of manufacturing the semiconductor module related to Aspect 10 of the present invention, in the above Aspect 9, the step of forming the plurality of light emitting elements further includes a step of causing the semiconductor layer having a thickness of 0.1 µm or more and 3 µm or less to remain such that a space between the light emitting elements adjacent to each other is shielded on the growth substrate side of the space in a top view, the laser light directed toward the base substrate during the laser irradiation passing through the space, and in which the semiconductor layer may be a nitride semiconductor layer.

According to the configuration, the same effect as in the above Aspect 2 is achieved.

According to the method of manufacturing the semiconductor module related to Aspect 11 of the present invention, in the above Aspect 9 or 10, the step of separating off the growth substrate may include a step of forming a surface of each of the plurality of light emitting elements on the growth substrate side in an uneven shape.

According to the configuration, the same effect as in the above Aspect 3 is achieved.

The method of manufacturing the semiconductor module related to Aspect 12 of the present invention according to the above Aspect 9 or 10 may further include a step of filling a groove between the light emitting elements adjacent to each other with a resin.

According to the configuration, the same effect as in the above Aspect 4 is achieved.

According to the method of manufacturing the semiconductor module related to Aspect 13 of the present invention, in the above Aspect 12, in the step of filling with the resin, filling with the resin may be performed such that an upper surface of the base substrate and the entire exposed surface of the light emitting element are covered.

According to the configuration, since the upper surface of the base substrate and the entire exposed surface of the light emitting element are covered with the resin, for example, an upper surface of the resin is planarized, and a planarized surface is easily formed in a polishing step of polishing a separated surface of the light emitting element. The planarized surface is formed, and thus a color conversion layer is easily applied.

According to the method of manufacturing the semiconductor module related to Aspect 14 of the present invention, in the above Aspect 12, the step of separating off the growth substrate may include a step of forming a surface of the resin on the growth substrate side in an uneven shape.

The method of manufacturing the semiconductor module related to Aspect 15 of the present invention according to the above Aspect 12 or 13 may further include a step of polishing a separated surface of the light emitting element.

According to the configuration, a residue can be made not to remain on the separated surface of the light emitting element by performing the step of polishing the separated surface of the light emitting element after the growth substrate is separated off. Therefore, it is possible to improve light extraction efficiency of the light emitting element. For example, in a case where a color conversion layer is formed on the light emitting element, the color conversion layer can be applied or patterned on a flat surface on which a residue does not remain. Therefore, in a case where a semiconductor module having the color conversion layer is manufactured, it is possible to improve product quality of the semiconductor module.

The method of manufacturing the semiconductor module related to Aspect 16 of the present invention according to the above Aspect 15 may further include a step of cleaning the separated surface of the light emitting element after the separated surface of the light emitting element is polished.

According to the configuration, a residue can be made not to remain on the separated surface of the light emitting element by performing the step of cleaning the separated surface of the light emitting element after the separated surface of the light emitting element is polished. Therefore, it is possible to improve light extraction efficiency of the light emitting element. For example, in a case where a color conversion layer is formed on the light emitting element, the color conversion layer can be applied or patterned on a flat surface on which a residue does not remain. Therefore, in a case where a semiconductor module having the color conversion layer is manufactured, it is possible to improve product quality of the semiconductor module.

A display apparatus related to Aspect 17 of the present invention may include the semiconductor module manufactured by using the method of manufacturing a semiconductor module according to any one of the above Aspects 9 to 16.

The present invention is not limited to the above-described respective embodiments, various changes may occur within the scope disclosed in the claims, and embodiments obtained through appropriate combination of technical means disclosed in different embodiments are also included in the technical scope of the present invention. A novel technical feature may be formed by combining technical means disclosed in the respective embodiments with each other.

REFERENCE SIGNS LIST 1, 10, 10A, 10B, 10C, 10D, 10E, 100A, 100B, 100C, 101A, 102A, 102B, 103, 104, 105, 106 SEMICONDUCTOR MODULE
11 BASE SUBSTRATE
11a DRIVE CIRCUIT
12 METAL WIRING
13, 62 INSULATING LAYER
14 ELECTRODE
15, 151a, 151b, 151c, 151d, 151e, 152 LIGHT EMITTING ELEMENT
16, 161, 161a, 161b, 162, 164, 164a RESIN
16a LIQUID RESIN
18, 181 a, 181b, 181c, 181d, 181e, 182, 183a, 183b GROWTH SUBSTRATE
19 DIVIDING GROOVE
21 GaN FILM
22a, 22b, 22c, 22d, 22e, 221 PROTRUSION
23a, 23b, 23c, 23d, 32, 71, 231 RECESS
31 LIGHT SHIELDING MEMBER
41 LIGHT TRANSMISSIVE RESIN
42, 43 COLOR CONVERSION LAYER
51, 52 LIGHT ABSORPTION LAYER
61 METAL TERMINAL
141 SUBSTRATE SIDE ELECTRODE
142 LIGHT EMITTING ELEMENT SIDE ELECTRODE
151 LIGHT EMITTING SURFACE
153a BLUE LIGHT EMITTING ELEMENT
153b GREEN LIGHT EMITTING ELEMENT
153c RED LIGHT EMITTING ELEMENT

The invention claimed is:

1. A semiconductor module comprising:
a ground substrate that is provided with a drive circuit;
a plurality of light emitting elements that are electrically coupled to the drive circuit;
an insulating layer formed on the outermost surface of the drive circuit except a terminal and an electrode; and
a resin that fills a groove between the light emitting elements adjacent to each other on the ground substrate side of the groove in a top view,
wherein a distance between the light emitting elements adjacent to each other is equal to or less than 20 µm in the top view, and
wherein, in the groove, the resin is formed on the insulating layer.

2. The semiconductor module according to claim 1, wherein a surface of the resin on an opposite side to the ground substrate is formed in an uneven shape.

3. A semiconductor module comprising:
a ground substrate that is provided with a drive circuit;
a plurality of light emitting elements that are electrically coupled to the drive circuit;
an insulating layer formed on the outermost surface of the drive circuit except a terminal and an electrode; and
a resin that fills a groove between the light emitting elements adjacent to each other on the ground substrate side of the groove in a top view,
wherein a semiconductor layer shields the groove between the light emitting elements adjacent to each other on an opposite side to the ground substrate in a top view, and
wherein, in the groove, the resin is formed on the insulating layer.

4. The semiconductor module according to claim 3, wherein a surface of each of the plurality of light emitting elements on an opposite side to the ground substrate is formed in an uneven shape.

5. The semiconductor module according to claim 3, wherein, the resin is a light shielding member or a light reflective member.

6. The semiconductor module according to claim 3, further comprising:
a plurality of color conversion layers that are respectively disposed on upper parts of the plurality of light emitting elements.

7. A display apparatus comprising the semiconductor module according to claim 3.

8. A method of manufacturing a semiconductor module comprising:
forming a plurality of light emitting elements from a semiconductor layer grown on a growth substrate;
separating off the growth substrate from the plurality of light emitting elements through laser irradiation; and
filling a groove between the light emitting elements adjacent to each other on the ground substrate side of the groove in a top view with a resin,
wherein forming the plurality of light emitting elements includes forming a distance between the light emitting elements adjacent to each other to be 0.1 µm or more and 20 µm or less in a top view, a laser light directed toward a ground substrate during the laser irradiation passing between the light emitting elements, and
wherein the plurality of light emitting elements are electrically coupled to a drive circuit formed on the ground substrate,
wherein an insulating layer is formed on the outermost surface of the drive circuit except a terminal and an electrode, and
wherein, in the groove, the resin is formed on the insulating layer.

9. The method of manufacturing the semiconductor module according to claim 8,
wherein forming the plurality of light emitting elements further includes causing the semiconductor layer having a thickness of 0.1 µm or more and 3 µm or less to remain such that a space between the light emitting elements adjacent to each other is shielded on the growth substrate side of the space in a top view, the laser light directed toward the ground substrate during the laser irradiation passing through the space, and wherein the semiconductor layer is a nitride semiconductor layer.

10. The method of manufacturing the semiconductor module according to claim 8,
wherein separating off the growth substrate includes forming a surface of each of the plurality of light emitting elements on the growth substrate side in an uneven shape.

11. The method of manufacturing the semiconductor module according to claim 8, further comprising:
filling a groove between the light emitting elements adjacent to each other with a resin.

12. The method of manufacturing the semiconductor module according to claim 11,
wherein, in filling with the resin, filling with the resin is performed such that an upper surface of the ground substrate and an entire exposed surface of the light emitting element are covered.

13. The method of manufacturing the semiconductor module according to claim 11,
wherein separating off the growth substrate includes forming a surface of the resin on the growth substrate side in an uneven shape.

14. The method of manufacturing the semiconductor module according to claim 11, further comprising:
polishing a separated surface of the light emitting element.

15. The method of manufacturing the semiconductor module according to claim 14, further comprising:
cleaning the separated surface of the light emitting element after the separated surface of the light emitting element is polished.

* * * * *